(12) United States Patent
Hasebe et al.

(10) Patent No.: US 6,924,548 B2
(45) Date of Patent: Aug. 2, 2005

(54) SEMICONDUCTOR DEVICE AND ITS MANUFACTURING METHOD WITH LEADS THAT HAVE AN INVERTED TRAPEZOID-LIKE SECTION

(75) Inventors: Hajime Hasebe, Hakodate (JP); Atsushi Fujisawa, Hakodate (JP); Makoto Aida, Hitachi (JP); Motoya Ishida, Hitachi (JP); Yasuhiro Kashimura, Kitaibaraki (JP); Yoichi Kinouchi, Hitachi (JP)

(73) Assignees: Hitachi, Ltd., Tokyo (JP); Hitachi Cable, Ltd., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 65 days.

(21) Appl. No.: 10/470,075

(22) PCT Filed: Dec. 10, 2001

(86) PCT No.: PCT/JP01/10787

§ 371 (c)(1),
(2), (4) Date: Jul. 25, 2003

(87) PCT Pub. No.: WO02/061835

PCT Pub. Date: Aug. 8, 2002

(65) Prior Publication Data

US 2004/0046240 A1 Mar. 11, 2004

(30) Foreign Application Priority Data

Jan. 31, 2001 (JP) ........................................ 2001-024321

(51) Int. Cl.⁷ .......................... H01L 23/50; H01L 21/60
(52) U.S. Cl. ...................... 257/674; 257/676; 438/123
(58) Field of Search ................................. 438/123, 124, 438/127; 257/666, 674, 676, 787

(56) References Cited

U.S. PATENT DOCUMENTS

| | | | | | |
|---|---|---|---|---|---|
| 5,654,585 | A | * | 8/1997 | Nishikawa | 257/666 |
| 6,355,502 | B1 | * | 3/2002 | Kang et al. | 438/110 |
| 6,448,633 | B1 | * | 9/2002 | Yee et al. | 257/666 |
| 6,696,749 | B1 | * | 2/2004 | Hung et al. | 257/669 |
| 2002/0041011 | A1 | * | 4/2002 | Shibata | 257/667 |
| 2004/0056337 | A1 | * | 3/2004 | Hasebe et al. | 257/667 |

FOREIGN PATENT DOCUMENTS

JP          11-260983          9/1999

\* cited by examiner

*Primary Examiner*—Stephen W. Smoot
(74) *Attorney, Agent, or Firm*—Reed Smith LLP; Stanley P. Fisher, Esq.; Juan Carlos A. Marquez, Esq.

(57) ABSTRACT

A semiconductor device having a seal member of insulative resin, tab suspension leads and leads exposed to the mounting surface of the seal member, a semiconductor element located in the seal member and fixed by an adhesive of the tab surface, and conductive wires for electrically connecting electrodes of the semiconductor element to the leads. At least a lead portion of the leads has an inverted trapezoid-like section configured of a upper surface embedded in the seal member, a lower surface exposed from the seal member, and side surfaces connecting the two side edges of the upper and lower surfaces. Two side edges of the upper surface are formed with machined surfaces, respectively, having one end connected to the upper surface and the other end connected to side surfaces. The machined surfaces are formed by the pressing process in different directions of extension with the upper and side surfaces.

87 Claims, 28 Drawing Sheets

FIG.5
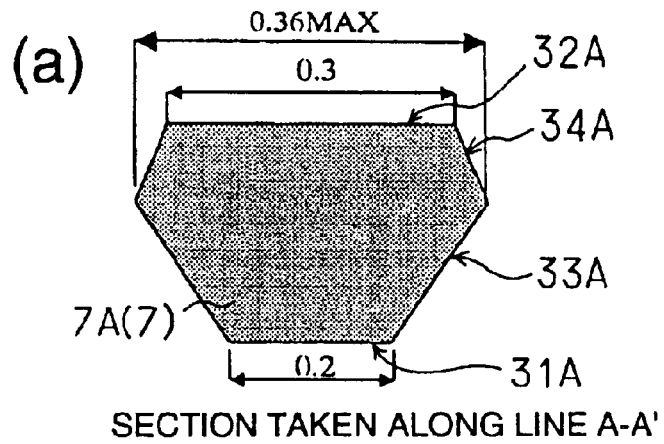
(a) SECTION TAKEN ALONG LINE A-A'
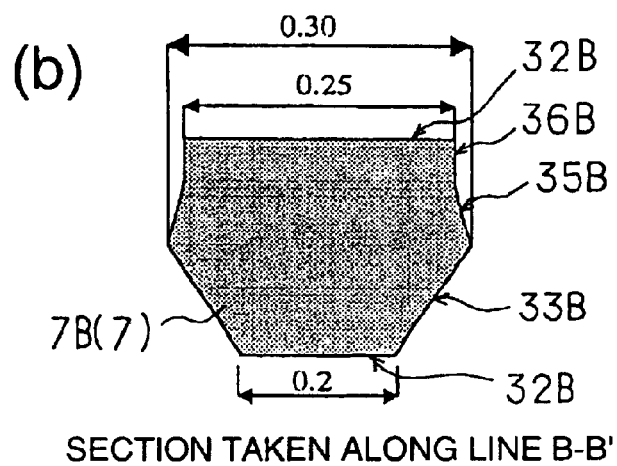
(b) SECTION TAKEN ALONG LINE B-B'
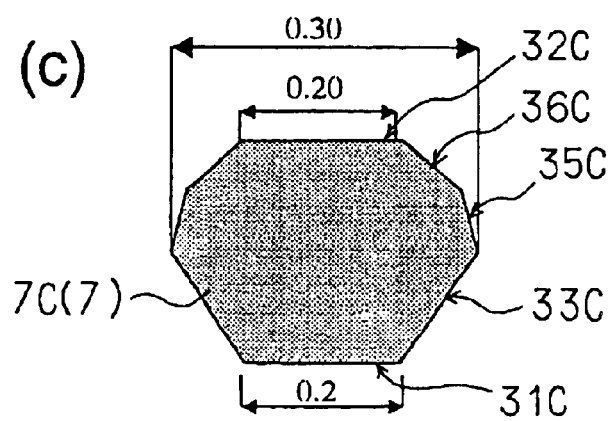
(c) SECTION TAKEN ALONG LINE C-C'

FIG.6
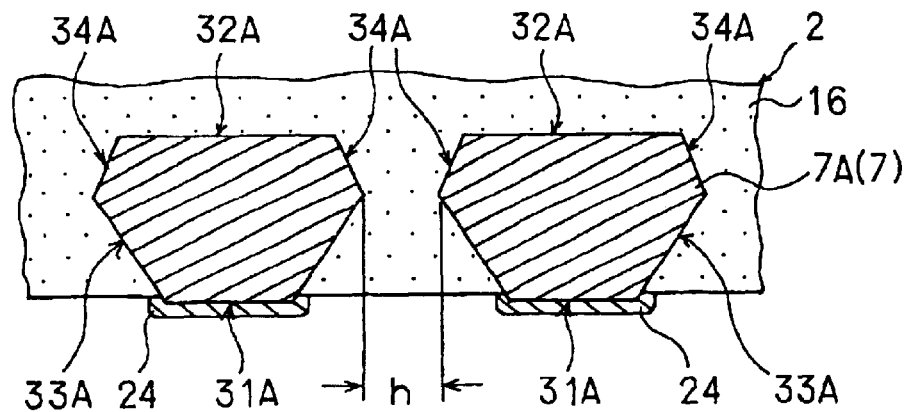
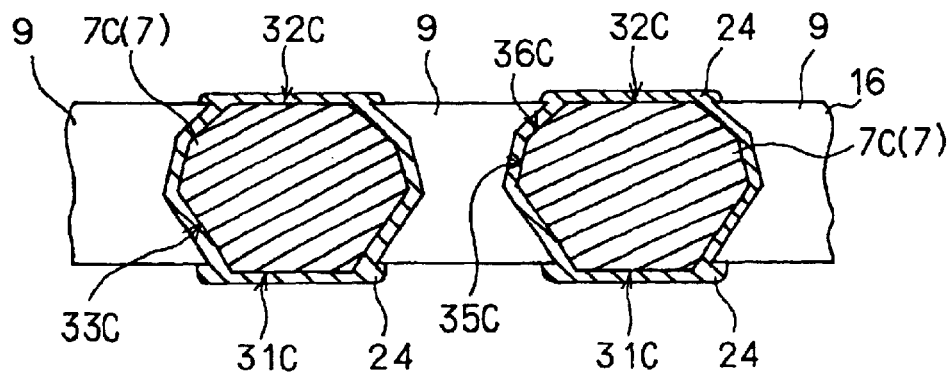
FIG.7
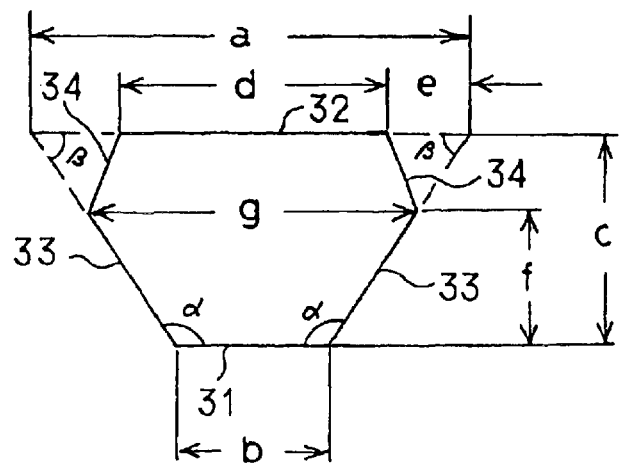

FIG.15
(a)
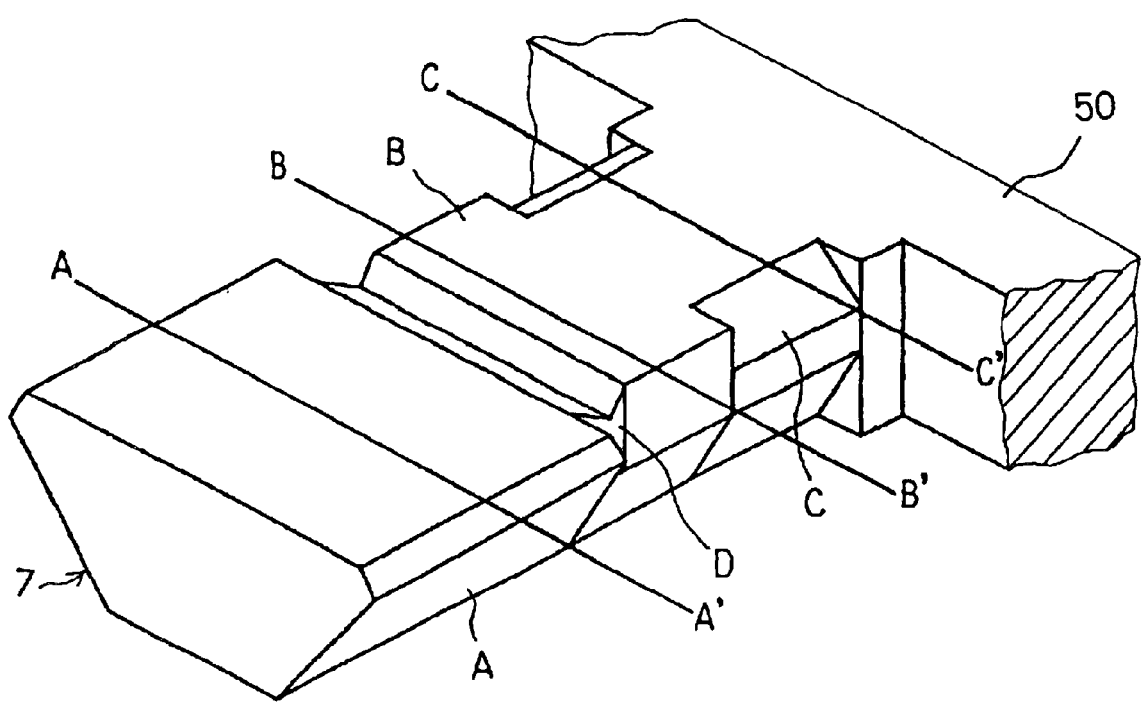
(b)
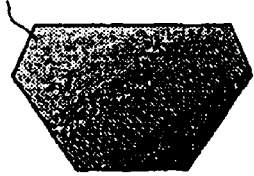
SECTION TAKEN
ALONG LINE A-A'
(c)
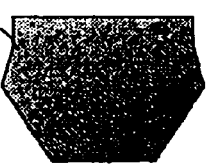
SECTION TAKEN
ALONG LINE B-B'
(d)
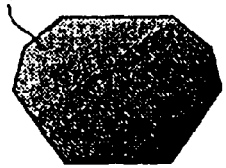
SECTION TAKEN
ALONG LINE C-C'

FIG.20
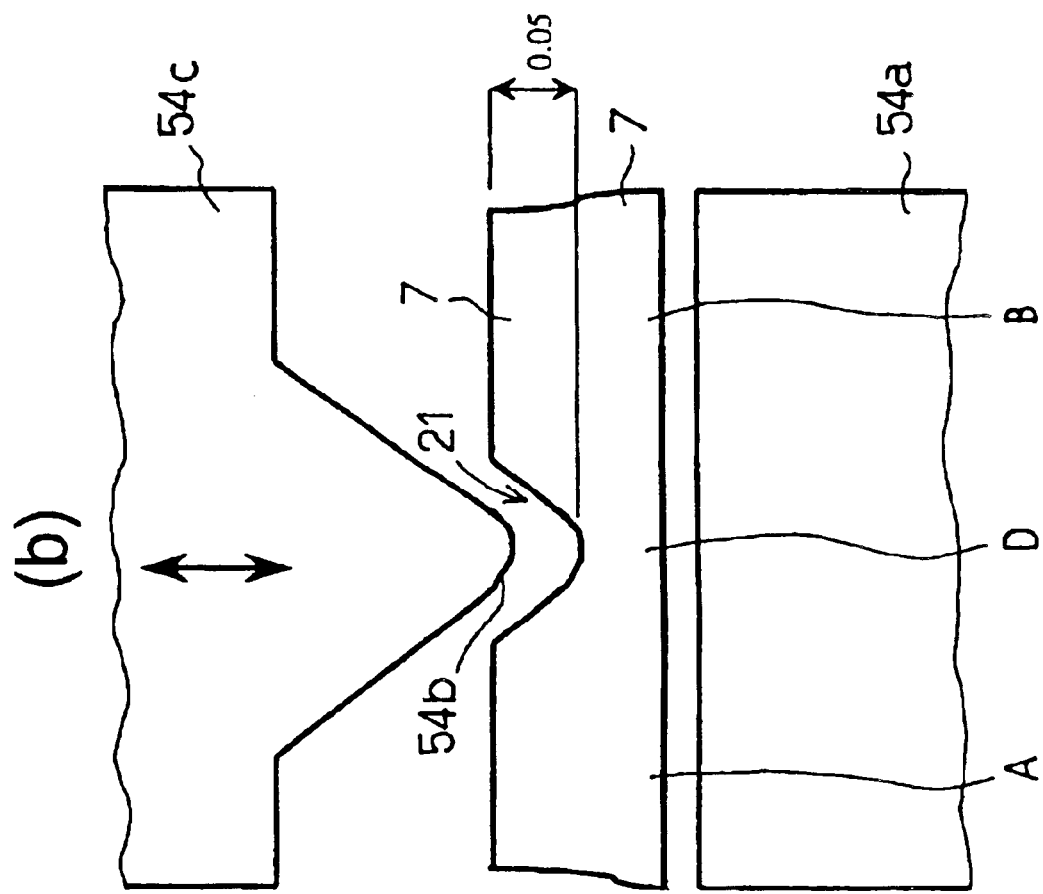
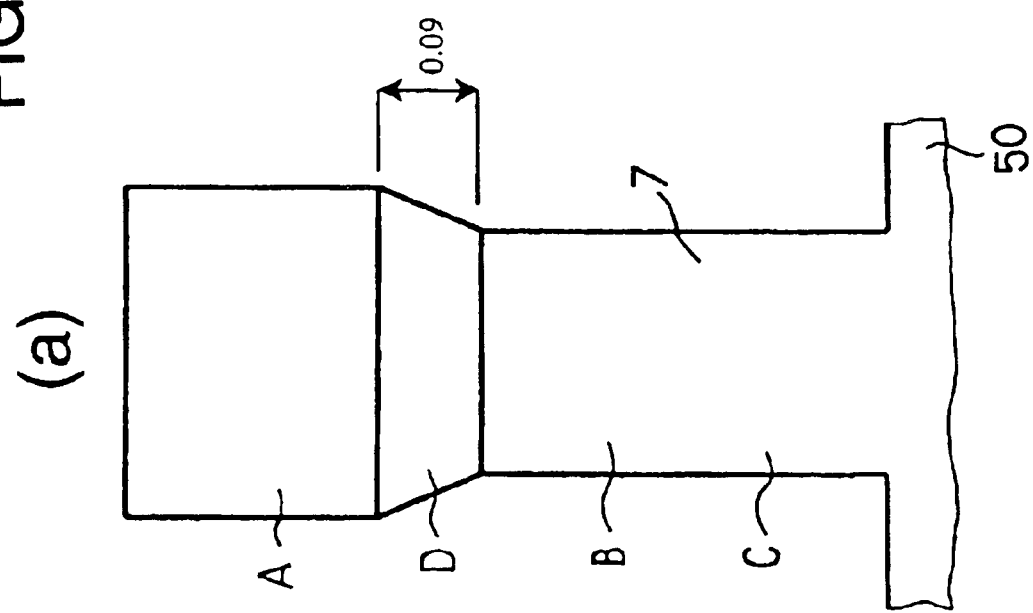

FIG.31
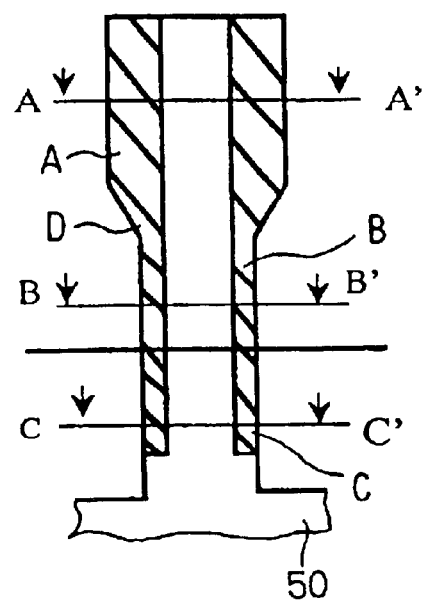
FIG.32
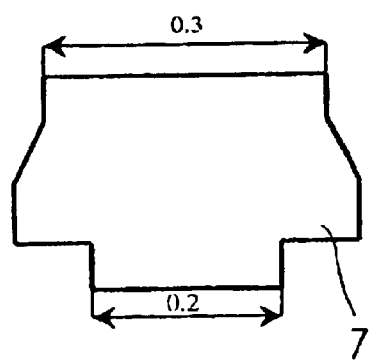
(a)
SECTION TAKEN ALONG LINE A-A'
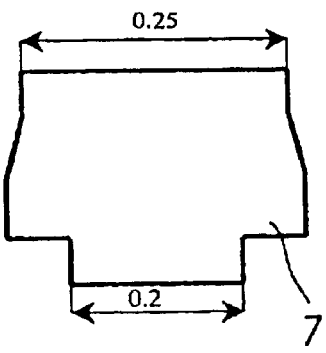
(b)
SECTION TAKEN ALONG LINE B-B'
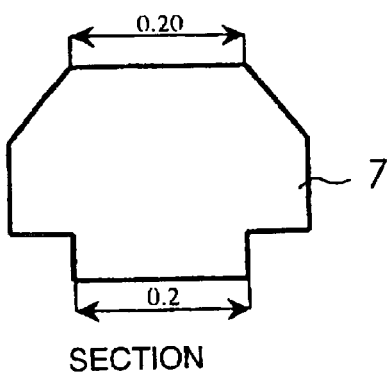
(c)
SECTION TAKEN ALONG LINE C-C'

FIG.37
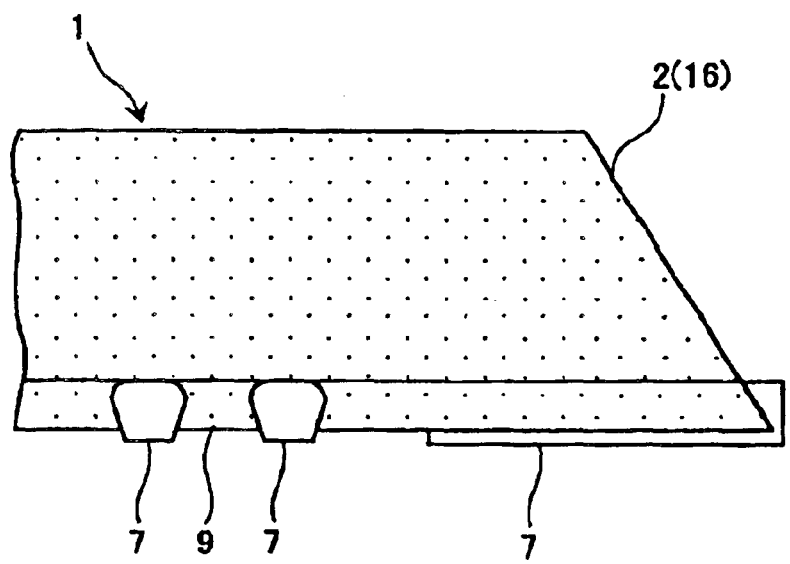
FIG.38 *Prior Art*
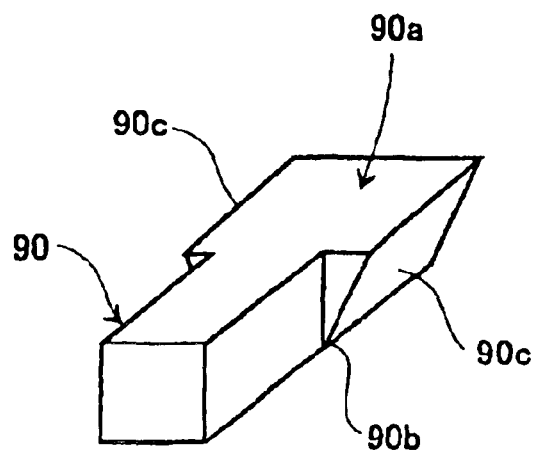

FIG.39 *Prior Art*
(a)
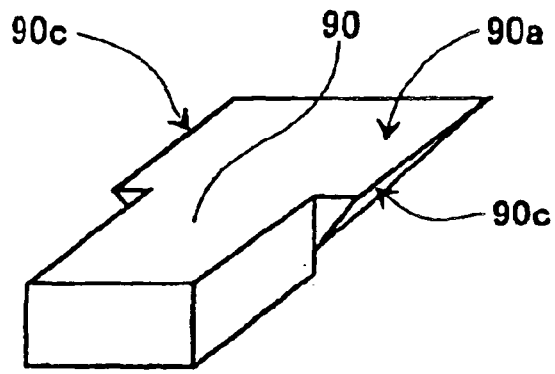
(b)
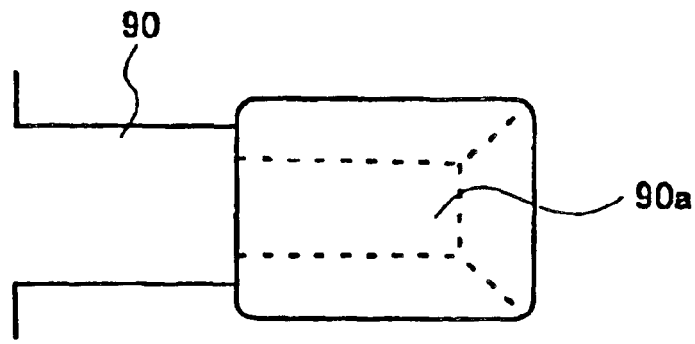
(c)
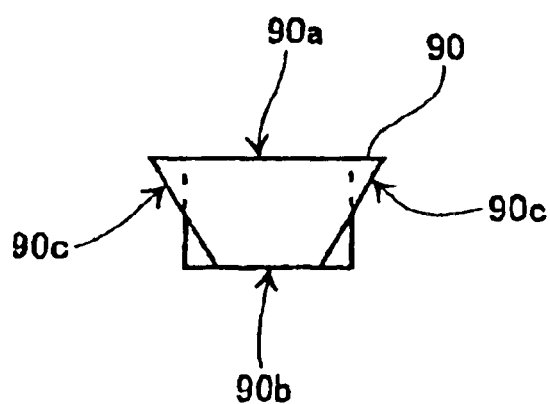

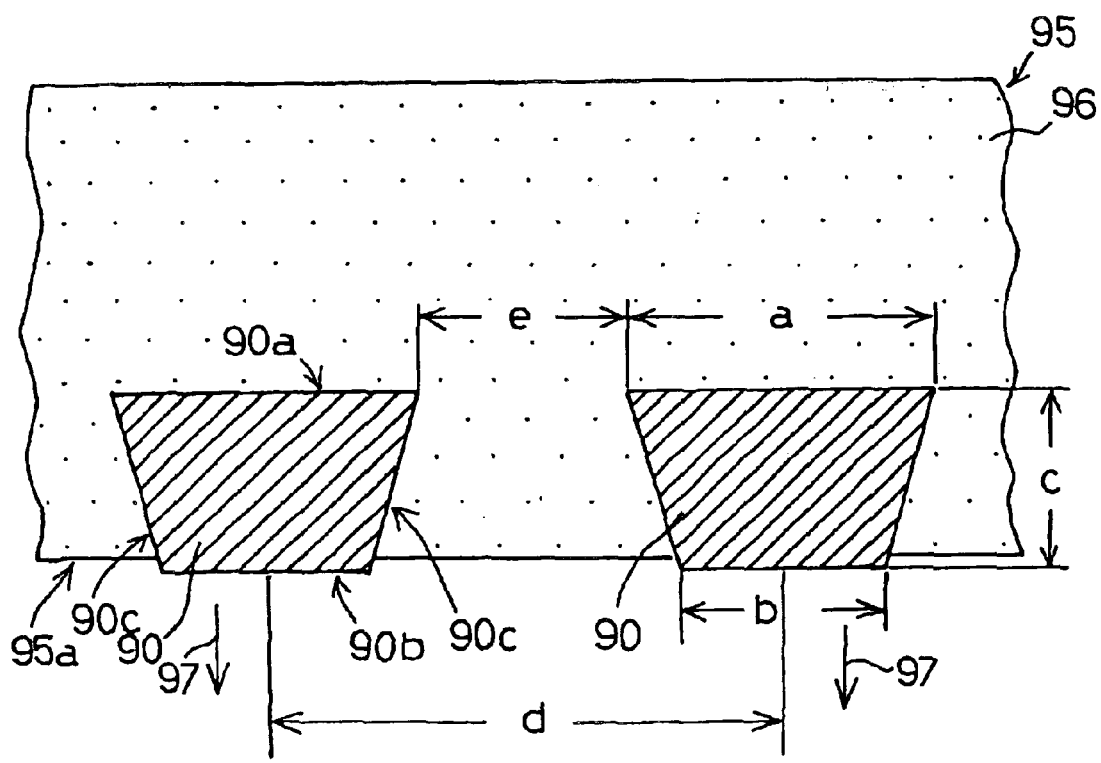
FIG.40 *Prior Art*

FIG.43
(a)
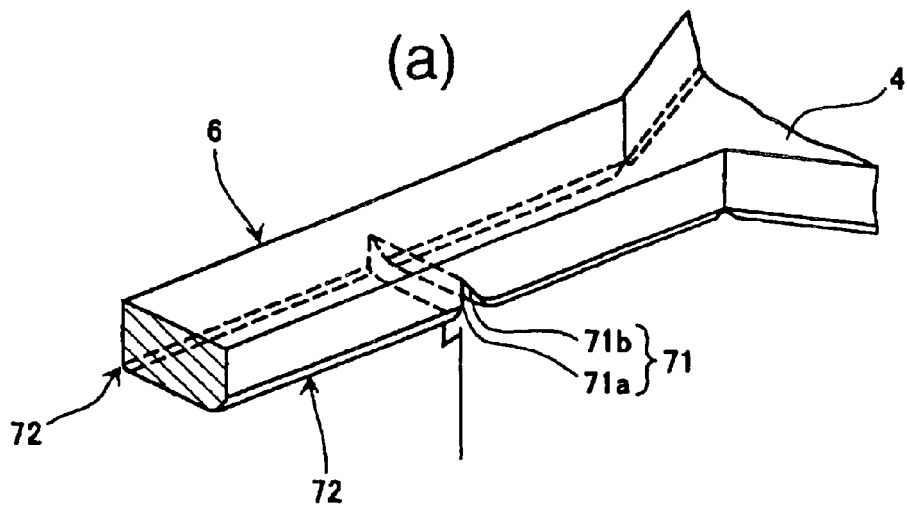
(b)
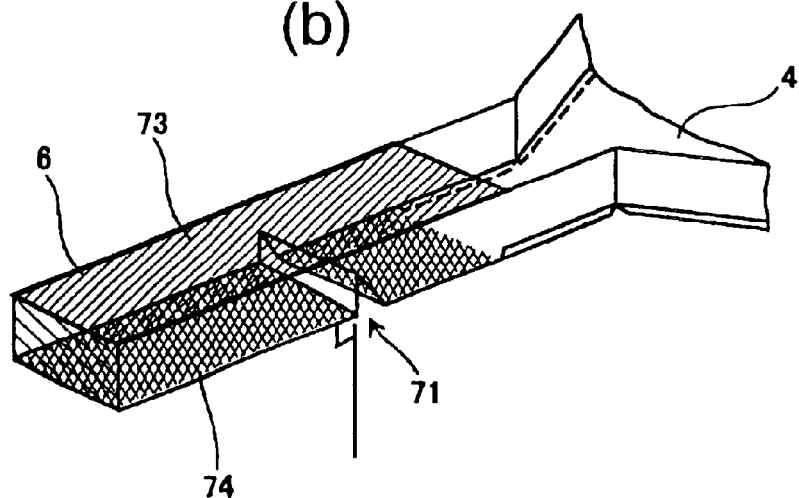
(c)
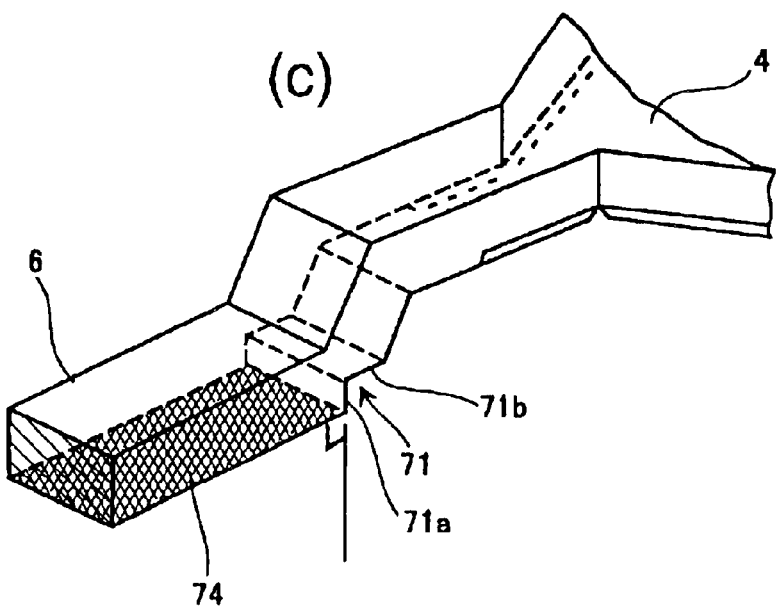

SEMICONDUCTOR DEVICE AND ITS MANUFACTURING METHOD WITH LEADS THAT HAVE AN INVERTED TRAPEZOID-LIKE SECTION

TECHNICAL FIELD

The present invention relates to a resin-sealed semiconductor device using a lead frame formed by stamping and a technique for fabricating an electronic apparatus having the semiconductor device built therein, or in particular to a technique effectively applicable to the fabrication of a semiconductor device (non-leaded semiconductor device) such as SON (Small Outline Non-Leaded Package) or QFN (Quad Flat Non-Leaded Package) with the external electrode terminals not intentionally protruded sideways of the package but exposed to the mounting surface side.

BACKGROUND ART

The resin-sealed semiconductor device is fabricated using a lead frame. The lead frame is produced by forming a metal plate into the desired pattern in a precision punching press or by etching. The lead frame includes a tab for fixing a semiconductor element (semiconductor chip), a support member called the die pad and a plurality of leads with forward ends (inner ends) thereof facing the periphery of the support member. The tab is supported by tab suspension leads extending from the frame portion of the lead frame.

In fabricating the resin-sealed semiconductor device with this lead frame, the semiconductor chip is fixed on the tab of the lead frame, the electrodes of the semiconductor chip and the forward ends of the leads are connected to each other by wires, respectively, and the inner end portion of each lead including the wire and the semiconductor chip is sealed with an insulative resin thereby to form a seal member (package). Then, the unrequited lead frame portion is cut off while at the same time cutting off the leads and the tab suspension leads protruded from the package.

As a resin sealed semiconductor device fabricated using the lead frame, a semiconductor device structure (non-leaded semiconductor device) is known in which a package is formed by the one-side molding on one surface of the lead frame and the leads making up external electrode terminals are exposed to one surface of the package so that no lead is intentionally projected from the peripheral surface of the package. Such semiconductor devices include SON with the leads exposed to the two side edges of one surface of the package and QFN in which the leads are exposed to the four sides of one surface of the square package.

JP-A-11-260983 discloses a method of fabricating a lead fame used for the resin sealed semiconductor device with the lower surface of the inner lead exposed from the reverse surface of the seal resin as an external terminal. This reference includes the description of a method of fabricating the lead frame with the inner lead having a tapered cross section.

In view of the trend toward a smaller semiconductor device and prevention of the bend of the lead making up an external electrode terminal, the non-leaded semiconductor device such as SON and QFN fabricated by a one-side molding is used. The non-leaded semiconductor device has a mounting surface formed by the lead surface exposed to one surface of the package, and therefore has a small packaging area as compared with the semiconductor device such as SOP (Small Outline Package) and QFP with the leads projected from the side surface of the package.

The non-leaded semiconductor device has a simple package structure in which the lower surface of the lead is exposed to the lower surface (mounting surface) of the package to have an external electrode terminal, and therefore the lead often comes off from the package. In order to make it difficult for the lead to come off from the package, the lead entering the package, i.e. the inner lead has a cross section in the shape of an inverted trapezoid (the tapered cross section described above). This inverted trapezoidal cross section is formed by etching.

JP-A-11-260983 discloses a technique for forming the inner lead by stamping. This publication points out the following fact and discloses an invention for obviating the problem point thereof.

FIG. 38 is a perspective view showing the forward end portion of the inner lead formed by etching as disclosed in JP-A-11-260983. When etching a thin metal sheet, the degree of the opening of the resist film formed in the upper surface and the lower surface of the sheet is changed. Thus, a lead having a tapered cross section can be fabricated.

The present applicant calls the lead 90 having the tapered cross section as an inverted trapezoidal section and a section approximate to such a section as an inverted trapezoid-like section.

In the prior art, the tapered cross section, i.e. the inverted trapezoid section includes an upper surface 90a of the lead 90, a lower surface 90b narrower than the upper surface 90a and a side surface 90c. The angle formed between the upper surface 90a and the side surface 90c is smaller than 90 degrees.

As described in JP-A-11-260983, the creation of an inverted trapezoidal section by etching has several disadvantages: (1) The limitation of the accuracy of the etching process makes it impossible to obtain a steady tapered section and deteriorates the yield. (2) The narrower pitch of the inner leads makes it difficult to secure the width of the inner lead and the space between the inner leads. (3) The shape of the tapered section is not stabilized thereby deteriorating the reliability of the semiconductor device.

In order to obviate these problems, according to the invention described in JP-A-11-260983, the tapered section (inverted trapezoidal section) is formed by stamping.

FIGS. 39a to 39c are a perspective view, a plan view and a right side view, respectively, of an inner lead (lead 90) having the tapered section (inverted trapezoidal section) described in JP-A-11-260983. In this structure, the upper surface of the tapered portion is increased for an increased contact area with the seal resin. Also, the seal resin circumvents under the side surface and therefore attaches more closely with a higher strength.

With the conventional lead structure having the inverted trapezoidal section described above, however, it has been found the strength for preventing the leads from coming off is decreased by the further reduction in the lead pitch, and the leads are more liable to come off from the seal member.

FIG. 40 is a sectional view schematically showing the correlation between the lead 90 having an inverted trapezoidal section and the seal resin 96 forming a seal member 95. In FIG. 40, reference character a designates the width of the upper surface 90a of the lead 90, character b the width of the lower surface 90b of the lead 90, character c the thickness (height) of the lead 90, character d the lead pitch and character e the shortest length between the leads.

Assume that a force of such a magnitude as to cause the lead 90 with the lower surface 90b exposed to come off from the seal member 95 is exerted on the mounting surface 95a corresponding to the lower surface of the seal member 95, as indicated by arrow 97. In view of the fact that the area of the seal resin corresponding to the portion having the shortest length e is smallest, the particular portion is liable to develop a crack often causing the lead 90 to come off from the seal member 95.

The strength of the seal resin 96 (the lead holding strength, i.e. the external electrode terminal strength) holding the lead 90 is higher, the longer the shortest length e between adjacent leads. With the lead pitch becoming shorter and shorter, the lead holding strength is on the decrease, so that the holding stability of the external electrode terminals of the non-leaded semiconductor device tends to decrease, thereby adversely affecting the reliability of the non-leaded semiconductor device. Also, the electronic apparatus having such a non-leaded semiconductor device is reduced in reliability.

As an example, in the case where the lead pitch d is set to 0.5 mm, the width a of the upper surface 90a of the lead 90 is about 0.3 mm, the width b of the lower surface 90b of the lead 90 is about 0.2 mm, the thickness (height) c of the lead 90 is about 0.2 mm, and the shortest length e between adjacent leads is about 0.2 mm. The larger the amount of the seal resin existing between adjacent leads (i.e. the shortest length e) which greatly contributes to the prevention of the lead from coming off, the better. In the case where the lead pitch d is 0.5 mm, however, the length e is already as short as 0.2 mm and the lead holding strength is low.

An object of the present invention is to provide a non-leaded semiconductor device having a large external electrode terminal strength and a high reliability of the terminals and a method of fabricating the same.

Another object of the invention is to provide a method of fabricating an electronic apparatus having a high packaging reliability of a packaged non-leaded semiconductor device.

The above and other objects and novel features of the invention will be made apparent by the description in this specification and the accompanying drawings.

DISCLOSURE OF THE INVENTION

Representative aspects of the invention disclosed in this patent application will be briefly described below.

(1) A semiconductor device comprising a seal member comprised of an insulative resin, a tab sealed by the seal member, at least a tab suspension lead exposed to the mounting surface of the seal member and connected to the tab, a plurality of leads having a surface thereof exposed to the mounting surface of the seal member, a semiconductor element located within the seal member and fixed to a surface of the tab through an adhesive, and conductive wires for electrically connecting the electrodes formed on the surface of the semiconductor element and the leads to each other, wherein at least a part of the leads is formed with an inverted trapezoid-like section including an upper surface embedded in the seal member, a lower surface opposed to the upper surface and exposed from the seal member, and the side surfaces connecting the two side edges of the upper and lower surfaces to each other respectively, and wherein the two side edges of the upper surface are each formed with a machined surface having an end thereof connected to the upper surface and the other end thereof connected to the corresponding side surface described above, the machined surfaces extending in a direction different from the upper surface and the side surfaces described above. The machined surfaces each make up a flat surface, and the cross section of the lead has a polygon. The angle formed between the upper surface and each of the machined surfaces is larger than 90 degrees. The angle formed between the lower surface and each of the side surfaces is larger than the angle formed between the upper surface and the corresponding side surface, thereby making up an inverted trapezoid-like section.

In the inverted trapezoid-like section described above, the length (width) between the point where the machined surface on one side joins the side surface on one side joins and the point where the machined surface on the other side joins the side surface on the other side is longest, the width of the upper surface is next longest, and the width of the lower surface is shortest.

The lead portions projected from the side surface of the seal member form an inverted trapezoid-like section having the machined surfaces, and the width of the upper surface of the inverted trapezoid-like section has a size equal to or very approximate to the width of the lower surface of the inverted trapezoid-like section. The surface of the lead portions exposed from the side surface of the seal member is formed with a plating film.

The leads each have a plurality of inverted trapezoid-like sections having different widths of the upper surface are arranged along the direction in which the leads extend. There are also a plurality of inverted trapezoid-like sections having different boundary heights from the lower surface of the inverted trapezoid-like section to the point where each of the side surfaces joins the corresponding machined surface. The boundary height changes stepwise. The width of at least a part of the lead portions located within the seal member is larger than the width of the lead portions projected from the side surface of the seal member.

The surface of the lead is formed with a groove, and the wire is connected to the portion of the lead surface nearer to the semiconductor element than the groove. The wire connection area is formed with a plating film selectively, and the wire is connected to the surface of the plating film.

The leads, the tab and the tab suspension leads are formed by stamping for punching through from the lower surface to the upper surface. Also, the rounding and the protrusion at the punched edge generated by the punching process are flattened by stamping.

The tab suspension lead is bent one step inward of the seal member at an intermediate portion thereof, and the obverse and reverse surfaces of the tab are located within the seal member. The reverse surface of the tab is formed with grooves, in which the insulative resin making up the seal member is filled. A groove is formed along each side of the square tab. In the case where the tab suspension lead is not bent, the reverse surface of the tab is formed with no groove and exposed to the mounting surface of the seal member.

The forward end surface of each lead projected from the side surface of the seal member is aligned with the forward end surface of the resin filled between the lead and an adjacent lead, while the forward end of each tab suspension lead projected from the side surface of the seal member is aligned with the forward end surface of the resin filled between the particular tab suspension lead and an adjacent lead.

This semiconductor device is fabricated by a method comprising:

(a) the step of producing a lead frame including a plurality of leads, a tab having a surface for fixing a semiconductor element, a plurality of tab suspension leads connected to the tab and a frame portion for coupling the leads and the tab suspension leads to each other;

(b) the step of mounting the semiconductor element through an adhesive on the surface for fixing the semiconductor element;

(c) the step of electrically connecting the electrodes of the semiconductor element to the leads through wires;

(d) the step of forming a seal member of the insulating resin in such a manner that the semiconductor element, the wires, the leads and the tab suspension leads are sealed with an insulative resin, and the reverse surface of each of the tab suspension leads and the leads is exposed from the insulative resin; and (e) the step of separating the leads and tab suspension leads from the frame portion, wherein the lead frame is fabricated in such a manner that patterns are formed by punching a metal plate comprised of the same material a plurality of times by stamping, after which a predetermined portion is subjected to the pressing process by stamping, wherein the pressing process is carried out in such a manner that at least a portion of the leads of the lead frame is formed into an inverted trapezoid-like section configured of an upper surface embedded in the seal member, a lower surface opposed to the upper surface and exposed from the seal member and side surfaces connecting the two side edges of the upper and lower surfaces, respectively, and wherein the two side edges of the upper surface are formed into machined surfaces (flat surfaces) each with an end thereof connected to the upper surface and the other end thereof connected to the corresponding one of the side surfaces, and extending in different directions from the upper surface and the side surfaces.

The leads, the tab suspension lead, the resin existing between the leads and the resin existing between each tab suspension lead and an adjacent lead are cut off from the frame portion at a position distant from and in proximity to the seal member along the outer periphery of the seal member. In the process, the forward end surface of the leads and the tab suspension leads is aligned with the forward end surface of the resin on the two sides of the leads and the tab suspension leads.

After forming the lead frame as a single flat metal plate, the tab suspension lead portion connected to the tab is extrusion molded by stamping one step, and the whole tab is covered by the process for forming a seal member with the insulative resin, in such a manner that the surface of the tab for fixing the semiconductor element is projected. The extrusion molding is performed in the last step of stamping for forming the lead frame. A plurality of grooves are formed (one along each side of the square tab) by stamping in the reverse surface of the tab. In the structure for exposing the reverse surface of the tab to the mounting surface of the seal member, the tab suspension leads are not extrusion molded nor are grooves formed in the reverse surface of the tab.

In forming the inverted trapezoid-like section as described above, the angle formed between the upper surface and each of the machine surfaces is set to larger than 90 degrees. Also, the same section is formed in such a manner that the length (width) connecting each of the machined surfaces and the corresponding one of the side surfaces is longest, the width of the upper surface is next longest and the width of the lower surface is shortest.

The lead portion projected to the side surface of the seal member is formed as an inverted trapezoid-like section having the machined surfaces in such a manner that the width of the upper surface of the inverted trapezoid-like section is equal to or very approximate to the width of the lower surface of the inverted trapezoid-like section.

A plurality of inverted trapezoid-like sections having different widths of the upper surface thereof are formed along the direction in which the leads extend. At the same time, in at least a part of the inverted trapezoid-like sections, the boundary height from the lower surface and the point where the side surfaces and the machine surfaces join each other is different from the corresponding height of the other inverted trapezoid-like sections.

A groove is formed by stamping along the width of each lead between the wire bonding area of the lead connected the wire and the outer end of the lead.

The protrusion and the rounding at the punched edge generated by the punch stamping of the leads, the tab and the tab suspension leads are flattened by stamping. Also, after the pressing process of the leads and the process for forming the groove in the lead surface, the leads are flattened by stamping.

The following effects can be achieved by the means (1) described above.

(a) At least a part of the leads incorporated in the seal member forms an inverted trapezoid-like section, and the two side edges of the upper surface of the inverted trapezoid-like section embedded in the seal member are each formed with a flat machined surface by the pressing process. The pressing process increases not only the interval between adjacent leads but the strength (terminal strength) of the seal resin for holding the leads.

(b) The presence of the machined surfaces formed by the pressing process in the inverted trapezoid-like section can increase the interval between adjacent leads. The terminal strength depending on the interval between adjacent leads being constant, therefore, the lead pitch can be reduced. As a result, the non-leaded semiconductor device can be reduced in size.

(c) In the inverted trapezoid-like section, the length (width) between the point where the machined surface on one side joins the side surface on one side and the point where the machined surface on the other side joins the side surface on the other side is longest, the width of the upper surface is next longest, and the width of the lower surface is shortest. For this reason, the leads do not easily come off from the mounting surface of the seal member for an increased terminal strength.

(d) The lead portion projected from the side surface of the seal member assumes an inverted trapezoid-like section having the machined surfaces, and the width of the upper surface of the inverted trapezoid-like section is equal to or very approximate to the width of the lower surface of thereof. Even in the case where a plating film is formed on the surface of the leads and pressed and projected to the two sides by stamping, therefore, as compared with the structure like the inverted trapezoidal section with the width of the upper surface largest, the interval between adjacent leads is not reduced so that the shorting between the leads which otherwise might be caused by the plating projection can be prevented.

(e) The leads each include a plurality of the inverted trapezoid-like sections having different widths of the upper surface along the direction in which the leads extend, and therefore the boundary portions have a step which can prevent the leads from coming off in the direction in which they extend.

(f) Along the direction in which the leads extend, there are a plurality of inverted trapezoid-like sections having different boundary heights from the lower surface of the inverted trapezoid-like section to the point where the side surface and each machined surface join each other. Therefore, the boundary portions have a step which prevents the leads from coming off in the direction in which they extend.

(g) The width of at least a part of the lead portions located within the seal member is larger than the width of the lead portions projected from the side surface of the seal member, and therefore, the leads can be prevented from coming off in the direction in which they extend.

(h) A groove is formed in the surface of each lead, and the seal resin making up the seal member is filled in the groove. Therefore, the leads and the seal resin are more closely attached to each other for an improved terminal strength. Also, the presence of the groove lengthens the path for water entering along the surface of the leads from the peripheral surface of the package, thereby making it possible to suppress the corrosion by water of the wires connected to the leads.

(i) The leads, the tab and the tab suspension leads are formed by the stamping process punching through from the lower surface to the upper surface. The protrusion and the rounding generated at the punched edge by the punching process are flattened by stamping. Thus, the problem which otherwise might be posed by the protrusion and the rounding generated by the punching process is obviated. With the structure in which the lower surface of the leads is exposed to the mounting surface of the seal member, for example, the exposed surface of the leads is not contaminated (flush failure) by the resin component flowing from the seal resin at the time of molding for forming the seal member.

(j) With the structure in which an intermediate portion of the tab suspension lead is bent by one step inward of the seal member and the tab is embedded in the seal member, assume that grooves are formed in the reverse surface of the tab. In such a case, the seal resin making up the seal member is filled in the grooves, and therefore the tab and the seal resin are more closely attached to each other, thereby making it difficult for any malfunction to occur which otherwise might be caused by the lack of closeness between the tab and the seal resin and the resulting heat generated at the time of packaging the semiconductor device.

(k) The forward end surface of a given lead projected from the side surface of the seal member is aligned with the forward end surface of the resin filled between the particular lead and an adjacent lead, while the forward end surface of a given tab suspension lead projected from the side surface of the seal member is aligned with the forward end surface of the resin filled between the particular tab suspension lead and an adjacent lead. Therefore, it becomes difficult for the shorting to occur between the leads which otherwise might be caused by the coupling member such as solder at the time of packaging.

(l) In view of the fact that the leads can be prevented from coming off from the seal member and the fact that the tab and the seal resin can be prevented from separating from each other, the structure according to the invention makes it possible to improve the yield of fabrication and thus achieve a reduced fabrication cost of the semiconductor device.

BRIEF DESCRIPTION OF THE DRAWINGS

FIG. 5 is sectional views taken along lines A–A', B–B' and C–C' in FIG. 4.

FIG. 6 is a sectional view showing an arrangement of the leads in the seal member and the leads projected from the seal member of the non-leaded semiconductor device.

FIG. 7 is a sectional view schematically showing a lead of the non-leaded semiconductor device.

FIG. 15 is an enlarged perspective view and a sectional view showing a lead portion of the lead frame.

FIG. 20 is a schematic diagram showing the lead portion formed with a V-shaped groove by the sequential press and the manner in which the V-shaped groove is formed.

FIG. 31 is a plan view showing the lead portion of a lead frame used in fabricating a non-leaded semiconductor device according to still another embodiment (third embodiment) of the invention.

FIG. 32 is sectional views taken in lines A–A', B–B' and C–C', respectively, in FIG. 31.

FIG. 37 is a partly enlarged sectional view showing a non-leaded semiconductor device according to yet another embodiment (seventh embodiment) of the invention.

FIG. 38 is a perspective view showing the forward end of the inner leads of the conventional resin-sealed semiconductor device.

FIG. 39 is a perspective view, a plan view and a right side view showing the forward end of the inner lead of the conventional resin-sealed semiconductor device.

FIG. 40 is a sectional view schematically showing the correlation between the leads having an inverted trapezoidal section and the seal resin forming a seal member.

FIG. 43 is perspective views schematically showing the steps of processing each of the tab suspension leads of the unit lead frame pattern.

BEST MODE FOR CARRYING OUT THE INVENTION

Figure 1:
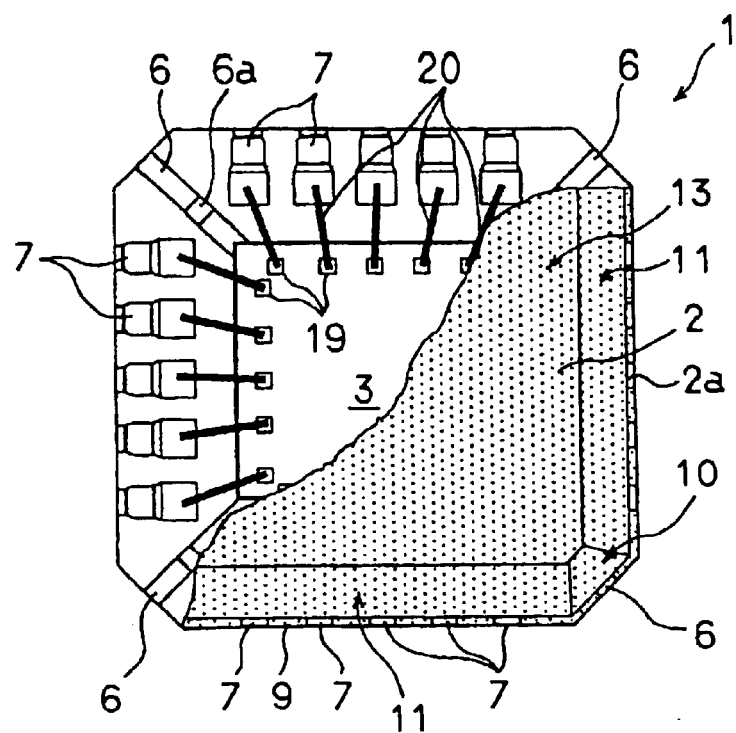
FIG. 1 is a plan view schematically showing a non-leaded semiconductor device with a part thereof cut away as a section according to an embodiment (first embodiment) of the invention.

Embodiments of the present invention will be explained in detail below with reference to the drawings. In all the drawings for explaining the embodiments of the invention, the component parts having the same functions are designated by the same reference numerals, respectively, and will not be described repeatedly.

(First Embodiment)

FIGS. 1 to 29 are diagrams relating to a semiconductor device, or in particular a non-leaded semiconductor device and a fabrication method thereof according to an embodiment (first embodiment) of the invention. Referring to the first embodiment, an explanation will be made of an application of the invention to a QFN semiconductor device in which leads and tab suspension leads are exposed to the mounting surface on the reverse side of a square seal member (package).

Figure 2:
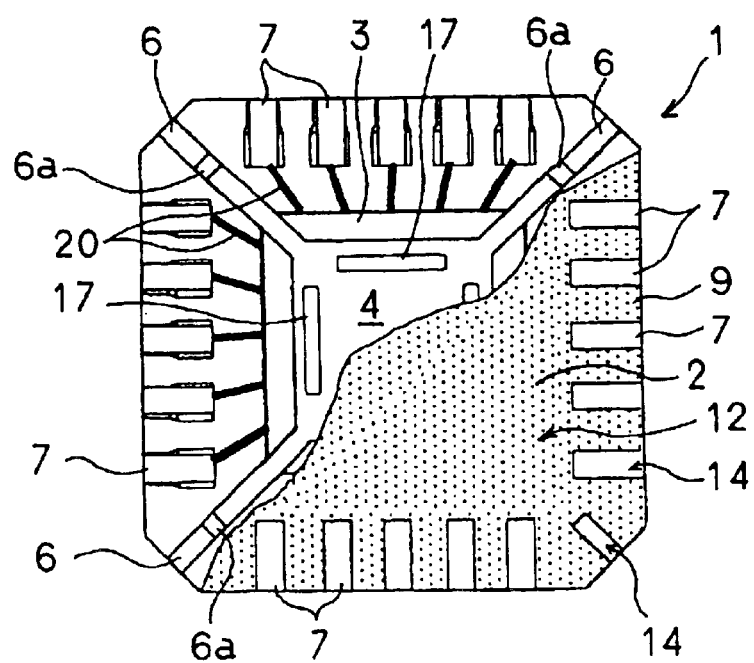
FIG. 2 is a bottom view schematically showing the non-leaded semiconductor device with a part thereof cut away as a section.
Figure 3:
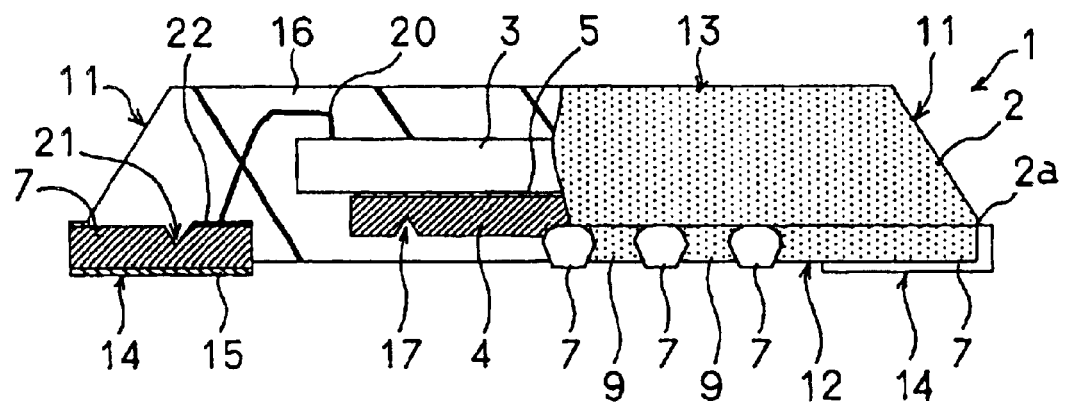
FIG. 3 is a front view schematically showing the non-leaded semiconductor device with a part thereof cut away as a section.

The QFN semiconductor device 1, as shown in FIGS. 1 to 3, includes a flat seal member (package) 2 formed of an insulative resin in the shape of a square (rectangle). A semiconductor element (a semiconductor chip or a chip) 3 is embedded in the package 2, and fixed by an adhesive 5 to the surface (main surface) of a square tab 4 (FIG. 3).

As shown in FIG. 3, the reverse surface (lower surface) of the package 2 has a packaging surface (mounting surface) 12). The first surfaces (mounting surfaces 14) of the tab suspension leads 6 and the leads 7 connected to the tab 4 are exposed to the mounting surface 12 of the package 2.

As shown in FIG. 2, the four corners of the tab 4 are connected to the tab suspension leads 6 extending radially. In the state of a lead frame, the tab suspension leads 6 make up members for supporting the tab 4. The tab 4, the tab suspension leads 6 and the leads 7 are made from a lead frame formed by patterning the same metal material (a single metal plate). The lead frame is formed of a copper plate, for example.

According to the first embodiment, the tab suspension leads 6 are each formed by extrusion molding an intermediate portion thereof by one step (a bend or a bent portion 6a). The direction of extrusion is toward the surface of the tab 4 where the semiconductor element is fixed. Thus, the lower surface of the tab 4 is not exposed to the mounting surface of the package 2. In the structure where the tab 4 is exposed to the mounting surface of the package 2, in contrast, the extrusion molding of the tab suspension leads 6 (the tab-raising process) is not performed. In such a case, the lead frame is flat.

A plurality of the leads 7 with the inner ends thereof located near to the tab 4 are arranged on the periphery of the tab 4 at predetermined intervals along each side of the square package 2. The outer ends of the tab suspension leads 6 and the leads 7 extend to the peripheral edge of the package 2. According to the first embodiment, this structure of the leads 7 is one of the features of the invention. This will be explained in detail later.

The package 2 is a flat square member with each of the corners thereof chamfered to a slant 10. One of the slants 10 has been connected to the gate by way of which resin has been injected at the time of forming the package 2, while the slants 10 at the other three corners have been connected to an air vent portion by way of which air has escaped at the time of forming the package 2.

Each of the side surfaces of the package 2 forms an inclined surface 11. The inclined surfaces 11 are the result of slanting the side surfaces of the mold cavity for facilitating the removal of the package from the mold dies. As shown in FIG. 3, therefore, the upper surface 13 is small as compared with the mounting surface 12 of the package 2. The outer end of each tab suspension lead 6 is exposed to the corresponding slant 10 of the package 2 (FIG. 1).

Figure 4:
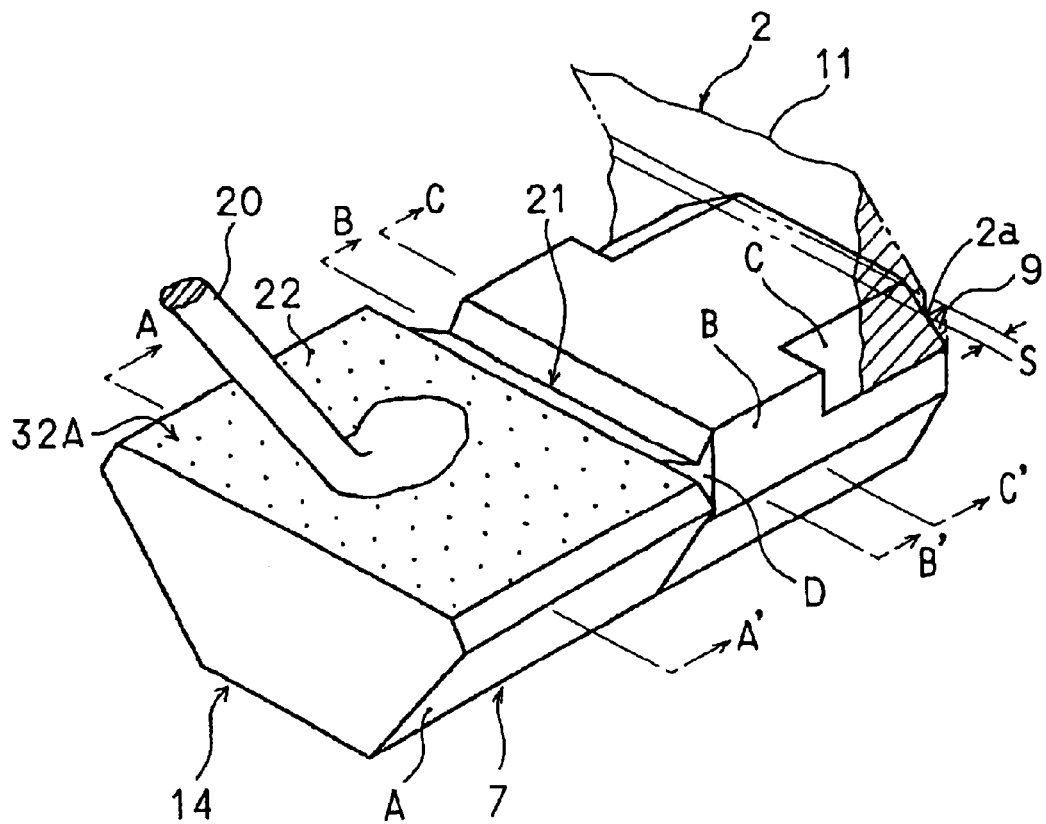
FIG. 4 is a perspective view showing the lead portion of the non-leaded semiconductor device.

As understood from FIGS. 1 and 3, the leads 7 and the tab suspension leads 6, on the surfaces thereof covered by the package 2, are projected slightly outward of the rising edge 2a of the package 2. This is the result of cutting off the leads 7 and the tab suspension leads 6 at the portions thereof displaced from the package 2. The leads 7 and the tab suspension leads 6 are thus projected from the side surfaces of the package 2, for example, by a length (s) not more than 0.1 mm (FIG. 4).

Also, as shown in FIGS. 1 and 3, a resin fin 9 is interposed between the adjacent ones of the leads 7 and between each tab suspension lead 6 and an adjacent one of the leads 7. The resin fin 9 is also cut off by a die and a punch. Therefore, the edges of the resin fins 6 and the outer ends of the leads 7 and the tab suspension leads 6 are aligned with each other without any unevenness along the peripheral edge of the package 2. The resin fins 9 are each a resin portion outside the rising edge 2a and as thick as or a slightly thinner than the leads 7.

According to the first embodiment, the resin fins 9 are thinner than the leads 7. This is by reason of the fact that a resin sheet is suspended between the upper and lower dies of the one-side transfer mold and the molding operation is performed with the particular sheet kept in contact with one surface of the lead frame so that the sheet bites between the leads. Thus, the resin fin 9 is thinned and a slight unevenness is caused between the reverse surface of the package and the leads and the tabs (FIG. 3). In the case where the sheet is not used, on the other hand, the resin fin 9 is as thick as, or depending on the degree of clearance, thicker than the leads 7.

After one-side transfer molding, the surfaces of the leads 7 and the tab suspension leads 6 are formed with a plating film 15. The presence of this plating film 15 further increases the step between the lower surface 12 of the package 2 and the leads 7 and the tab 4.

The structure in which the mounting surface 14 providing the lower surface of the leads 7 and the tab suspension leads 7 is offset as described above has the advantage that the solder wetting area can be specified and therefore the semiconductor device 1 can be packaged satisfactorily with solder on the wiring board such as a packaging board.

As seen from FIG. 3, the semiconductor element 3 is fixed on the surface (upper surface) of the tab 4 in the package 2 through the adhesive 5, which is comprised of the Ag paste, for example.

The tab 4, as shown in FIGS. 2 and 3, is square in shape and is fully embedded in the seal resin 16 forming the package 2. Grooves 17 are formed in the lower surface of the tab 4. The grooves 17 are formed by stamping. The grooves 17, as shown in FIG. 2, are formed, for example, along the sides of the square in the lower surface of the tab 4.

The grooves 17 are filled with the seal resin 16. The presence of the grooves 17 increases the bonding area (close contact area) between the tab 4 and the biphenyl resin (seal resin 16) making up the package 2. Also, with this structure, the resin bites into the grooves 17 of the tab 4, and therefore the tab 4 cannot be easily separated from the resin, thereby making it difficult for water to stay in the boundary surface between the tab 4 and the resin. As a result, the damage by an explosion which otherwise might be caused by the thermal expansion of water due to the heat generated at the time of packaging the QFN semiconductor device hardly occurs between the tab 4 and the seal resin 16.

The upper surface of the semiconductor element 3, as shown in FIG. 1, is formed with electrodes 19 along the sides of the square. The electrodes 19 are each connected with an end of the corresponding one of the wires 20. The other end of the wire 20 is connected to the surface of the inner end portion of the leads 7. The other end of the wire 20 is connected to the surface of the inner end portion of the corresponding one of the leads 7. The forward end side of each lead 7 is formed with a groove 21 by stamping along the transverse direction of the leads. The forward end side portion of the groove 21, i.e. the portion of the groove 21 nearer to the semiconductor element 3 has a wire connection area. The portion of the upper surface of each lead 7 nearer to the forward end thereof than the groove 21 is formed with a plating film 22 (FIG. 3). The wires 20 are connected on this plating film 22. The wires 20 are comprised of Au, for example, and the plating film 22 is formed of Ag, for example. The wires 20 are connected to a copper surface not directly but through the Ag plating film formed on the copper surface. Therefore, the connection strength of the wires is improved for a higher reliability of the semiconductor device.

The presence of the groove 21 in the upper surface of each lead 7 increases the bonding area (close contact area) between the leads 7 and the seal resin 16 on the one hand and the bite of the resin into the grooves 21 improves the connection strength between the leads 7 and the seal resin 16 on the other hand, thereby making it difficult for the leads 7 to come off from the seal resin 16.

On the other hand, one of the features of the invention lies in that the leads 7 with the lower surface thereof exposed to the mounting surface 12 of the package 2 have an inverted trapezoid-like section as shown in FIG. 4. The side surface of the package 2 is shown on the right side of FIG. 4, and the slant 11 and the rising edge 2a are indicated by two-dot chains. Also, the resin fin 9, though partly, is indicated on the side surface of the lead 7. Character s designates the portion of the lead 7 and the resin fin 9 projected from the side surface of the package 2.

In FIG. 4, the portion of the lead 7 leftward of the slant surface 11 is located in the package 2, and the lower surface 14 providing the mounting surface 14 is exposed from the mounting surface 12 providing the lower surface of the package 2.

The lead 7 includes, though not specifically limited, along the direction in which it extends, a wide portion A (A) with the upper surface thereof connected to the wire 20, a portion C (C) projected from the side surface of the package 2, a portion B (B) inside the portion C, and a portion D (D) connecting the portions C and A. The sectional views of the portion A (A), the portion B (B) and the portion C (C) are shown in FIG. 5. The portions A to D all have an inverted trapezoid-like section. The portion C (C) has an end thereof exposed from the package 2. The upper surface of the remaining part of the portion C (C) and the upper surfaces of the portion A (A), the portion D (D) and the portion B (B) are embedded in the package 2, while only the lower surfaces thereof are exposed.

The term "inverted trapezoid-like section" as used herein is defined as such a cross section that the two side edges of the upper surface of an inverted trapezoidal section are pressed and that machined surfaces are generated directly or by a deformation process.

The inverted trapezoid-like section 30 will be explained with reference to FIG. 7. FIG. 7 shows the inverted trapezoid-like section 30 and an inverted trapezoidal section 38 plotted by two-dot chain in a superposed relation with the inverted trapezoid-like section 30.

The inverted trapezoidal section 38 includes a lower surface 31, an upper surface 32 extending in opposed relation to the lower surface 31 and wider than the lower surface 31, and side surfaces 33 connecting the edges of the lower surface 31 and the edges of the upper surface 32, respectively. The angle α formed between the lower surface 31 and each side surface 33 is larger than the angle β formed between the upper surface 32 and each side surface 33 thereby forming an inverted trapezoidal section. Assume that the width of the upper surface 32 of the inverted trapezoidal section 38 is a, the width of the lower surface 31 thereof is b, and the thickness (height) thereof is c.

The inverted trapezoid-like section 30 according to the first embodiment includes machined surfaces 34 formed by pressing the edge portions on the two sides of the upper surface 32, or obtained as the result of the deformation caused by the pressing process. With reference to FIG. 7, an explanation will be made using the machined surfaces 34 formed directly by the pressing process. Each machined surface 34, though flat in FIG. 7, may be either multi-stage flat surfaces or an arcuate surface. In the case of a flat surface or flat surfaces, the inverted trapezoid-like section 30 is a polygon.

In the inverted trapezoid-like section 30 according to the first embodiment, the length (width: g) between the point where the machined surface 34 on one side of the lead 7 joins the side surface 33 on one side thereof and the point where the machined surface 34 on the other side of the lead 7 joins the side surface 33 on the other side thereof is longest, the width (d) of the upper surface 32 is next longest, and the width (b) of the lower surface 31 is shortest. In view of the fact that the width g of the intermediate portion is longest, the two side edges of this portion bite into the seal resin 16. Thus, the leads 7 hardly come off from the mounting surface 12. The larger the difference between the width g of the intermediate portion and the width (b) of the lower surface 31, the larger the amount of the seal resin 16 existing under the side surfaces 33, thereby leading to a larger strength of the terminal.

Assume that the distance (boundary height) between the point where the machined surface 34 joins the side surface 33 and the lower surface 31 is given as f. Also, in explaining each part of the inverted trapezoid-like section 30 at the portion A (A), the portion D (D), the portion B (B) and the portion C (C), the characters A to D will be attached following the reference numerals, respectively.

According to the first embodiment, though not specifically limited, the boundary height f is the same for the portion B (B) and the portion C (C), and larger for the portion A (A). The portion D (D) is so structured that one side thereof is connected to the high portion A (A), and the other side to the low portion B (B). The sections at the portion D (D) and the portion B (B) are intermediate ones for connecting the sections at the portion A (A) and the portion C (C) "softly" to each other. These sections are selected so that no stress may be concentrated locally on the lead or no unreasonable force may be imposed by the pressing process. Therefore, the invention is not limited to this embodiment. Also, by changing the sectional shape, a particular section thus changed provides a trap which bites into the seal resin 16 and functions to prevent the leads 7 from coming off in the direction of extension thereof.

The upper surface 32 of the portion D (D) is formed with a groove 21 as shown in FIGS. 3 and 4. The seal resin 16 bites into the groove 21, and therefore the bonding strength (close contacting strength) between the leads 7 and the seal resin 16 is improved.

In FIG. 5 and subsequent drawings, figures indicating the sizes are noted in the sectional view of the lead 7 only for reference, and the invention is not of course limited to these figures.

According to the first embodiment, as shown in FIGS. 5, 1 and 2, the width of the upper surface 32 of the inverted trapezoid-like section 30 of each lead 7 increases progressively from the outer end toward the inner end thereof, thereby preventing the lead 7 from coming off along the direction in which it extends. In FIG. 4, the upper surface 32A of the portion A (A) is formed with a plating film 22 as indicated by dots, and the wire 20 is connected on the plating film 22. Also, the lower surface 31C and the upper surface 32C of the portion of the lead 7 projected from the package 2, i.e. the portion C (C) of the lead 7 have the same width, as shown in FIG. 6(b).

This is in order to prevent the shorting between the leads 7 by decreasing the width of the lower surface 31C and the width of the upper surface 32C in view of the fact that when the lead 7 cut off, the plating films 24 on the surfaces of the lead 7 are pressed and the lead 7 extends out from the two sides under the pressure exerted from the two vertical directions, from above and under the lead 7, by the die holder. The shorting between the leads, which is generated also by the foreign matter attached, occurs at a higher rate, the narrower the space between the leads. To cope with this problem, the first embodiment employs a configuration with a widened space between the leads. The width of the lower surface 31C and that of the upper surface 32C are not limited to the same size, but may be approximate to each other to prevent the shorting between the leads. The plating films 24 are formed on the surface of the lead 7 exposed from the package 2 (seal member) after forming the package 2.

As described above, with the inverted trapezoid-like section 30 equivalent to the inverted trapezoidal section 38 formed with the machined surfaces 34, the width of the upper surface 32 is given as d which is about 2e shorter than the width a of the upper surface 32 of the inverted trapezoidal section 38. This is indicative of the fact that the space between adjacent leads is increased by about 2e as compared with the case in which the whole side surfaces of the lead 7 are machined into a tapered form. Thus, as shown in FIGS. 6(a), 6(b), the thickness of the seal resin 16 interposed between the adjacent leads 7 is increased along the direction in which the leads are arranged. As a result, the strength by which the seal resin 16 holds the leads 7 is remarkably increased beyond that for the conventional inverted trapezoidal section 38. Specifically, with the leads 7 having the inverted trapezoid-like section 30 according to the first embodiment, the strength of the seal resin between the terminals increases to such an extent that the separation of the leads 7 from the package 2 can be prevented.

Also, the space between the adjacent leads being constant, the pitch of the leads can be further reduced. In this way, the pitch of the leads or the package size, and hence the size of the semiconductor device can be reduced.

The inverted trapezoid-like section, though horizontally symmetric in the case under consideration, may alternatively be asymmetric with equal effect.

The portion C (C), in which the two side edges of the upper surface are pressed in multiple stages or two stages in the shown case, has primary machined surfaces 35C and secondary machined surfaces 36C. The primary machined surfaces 35C and the secondary machined surfaces 36 of the portion C (C) are slanted and form a polygonal section. In the portion A (A), the portion D (D) and the portion C (C), the angle formed between the upper surface and each machined surface is larger than 90 degrees. Also, the boundary height f is changed stepwise between the portion A (A) and the portion B (B), changed continuously in the portion D (D), and remains unchanged in the portions B (B) and C (C).

According to the first embodiment, the leads 7, the tab 4 and the tab suspension leads 6 are formed by stamping for punching through a lead frame not shown from the lower surface to the upper surface (the surface having the one on which the semiconductor element is fixed) thereof. The protrusions and the roundings generated at the punched edge by the punching process, however, are flattened by stamping or, for example, coining.

An example of the size of each part of the semiconductor device 1 will be described. The thickness of the lead frame (the tab 4, the tab suspension leads 6 and the leads 7) is about 0.2 mm, the thickness of the chip 3 is about 0.28 mm, the thickness of the semiconductor device 1 is 1.0 mm, the length of the leads 7 is about 0.6 mm, the wire connection area of the leads 7 is about 0.2 to 0.3 mm from the inner end of the leads 7, the interval between the outer edge of the tab 4 and the inner end of the leads 7 is about 0.2 mm for the exposed tab structure, and about 0.75 mm for the built-in tab structure.

Figure 8:
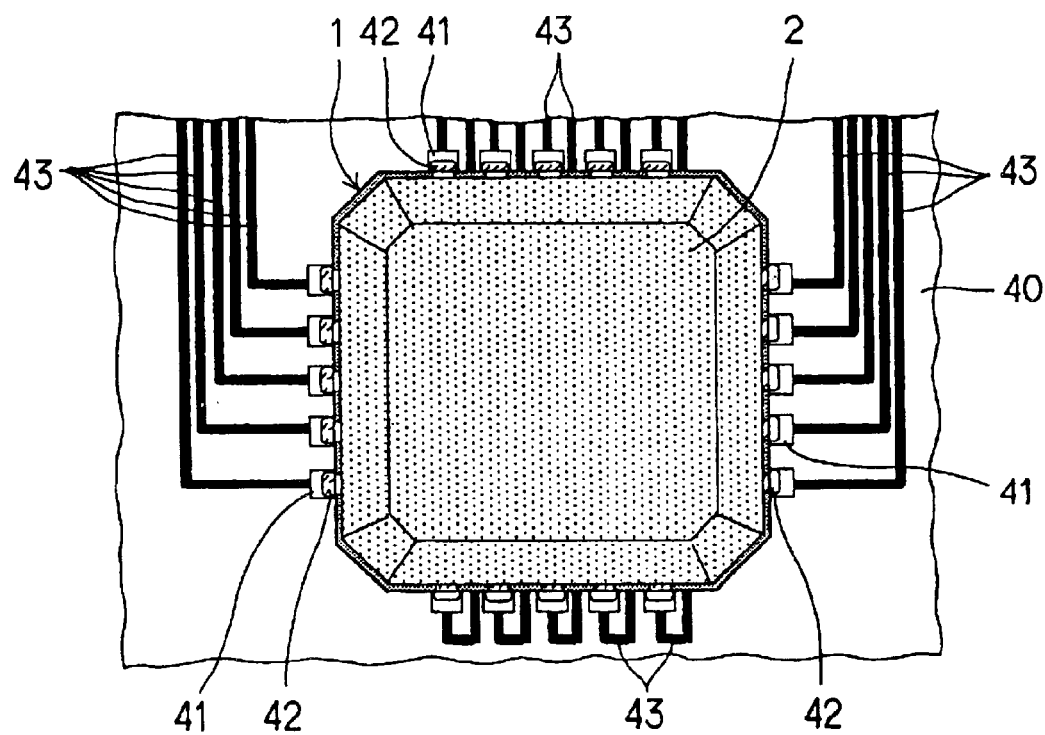
FIG. 8 is a plan view schematically showing a part of an electronic apparatus with a non-leaded semiconductor device mounted thereon according to the first embodiment of the invention.
Figure 9:
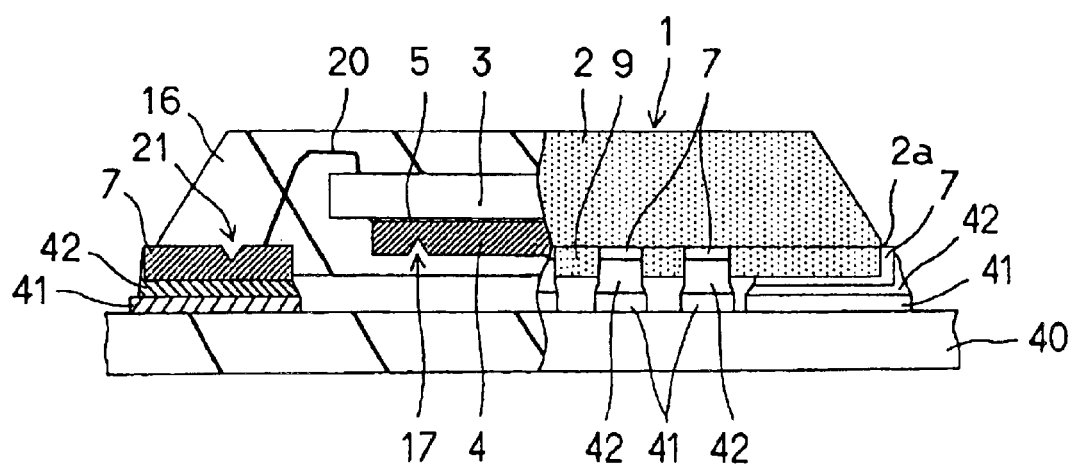
FIG. 9 is a plan view schematically showing a part of an electronic apparatus with a non-leaded semiconductor device mounted thereon according to the first embodiment of the invention.

FIGS. 8 and 9 are sectional views showing the semiconductor device 1 mounted on the packaging board 40 including a wiring board. One surface of the packaging board 40 is formed with electrodes (lands) 41 corresponding to the leads 7 providing the external electrode terminals of the semiconductor device 1 an the tab suspension leads. The leads 7 making up the external electrode terminals of the semiconductor device 1 and the tab suspension leads 6 are superposed on the lands 41 while at the same time being electrically connected thereto through a coupling member 42 of solder or the like. The lands 41, as shown in FIG. 7, are formed of a part of the wiring 43.

By incorporating this semiconductor device 1 in the packaging board 40, the desired electronic apparatus is fabricated. In this electronic apparatus, the leads 7 are not easily separated from the package 2. Thus, such a malfunction rarely happens in which the leads 7 come off from the package 2 and the semiconductor device 1 is separated from the packaging board 40 under a small external force, thereby improving the packaging reliability of the semiconductor device 1.

Figure 10:
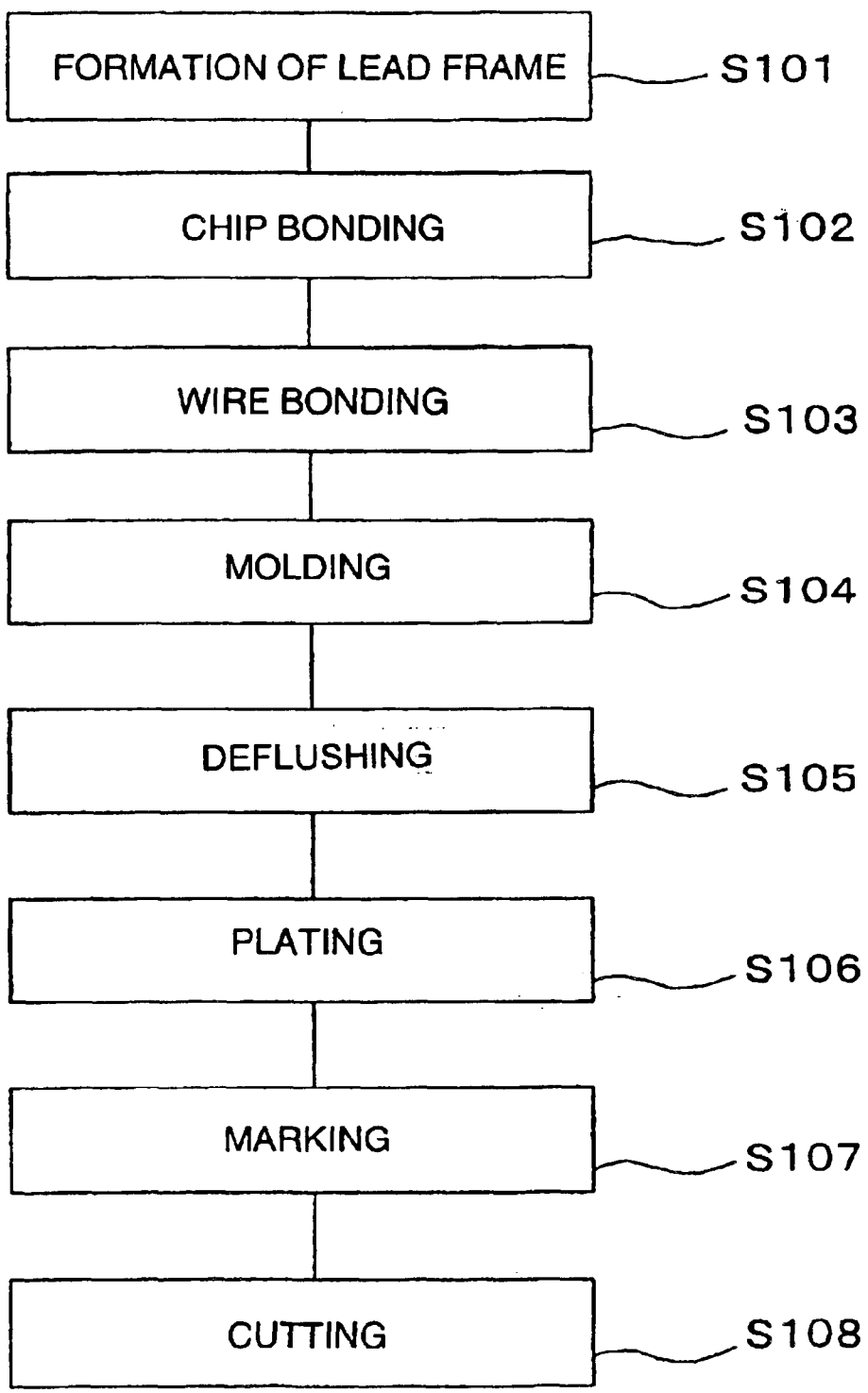
FIG. 10 is a flowchart showing the steps of fabricating the non-leaded semiconductor device according to the first embodiment of the invention.

Now, a method of fabricating the non-leaded semiconductor device according to the first embodiment will be explained with reference to FIGS. 10 to 29. The semiconductor device is fabricated, as shown in the flowchart of FIG. 10, by sequentially following the steps of forming the lead frame (S101), chip bonding (S102), wire bonding (S103), molding (S104), deflushing (S105), plating (S106), marking (S107) and cutting (S108). These steps will be described below sequentially in that order.

Figure 11:
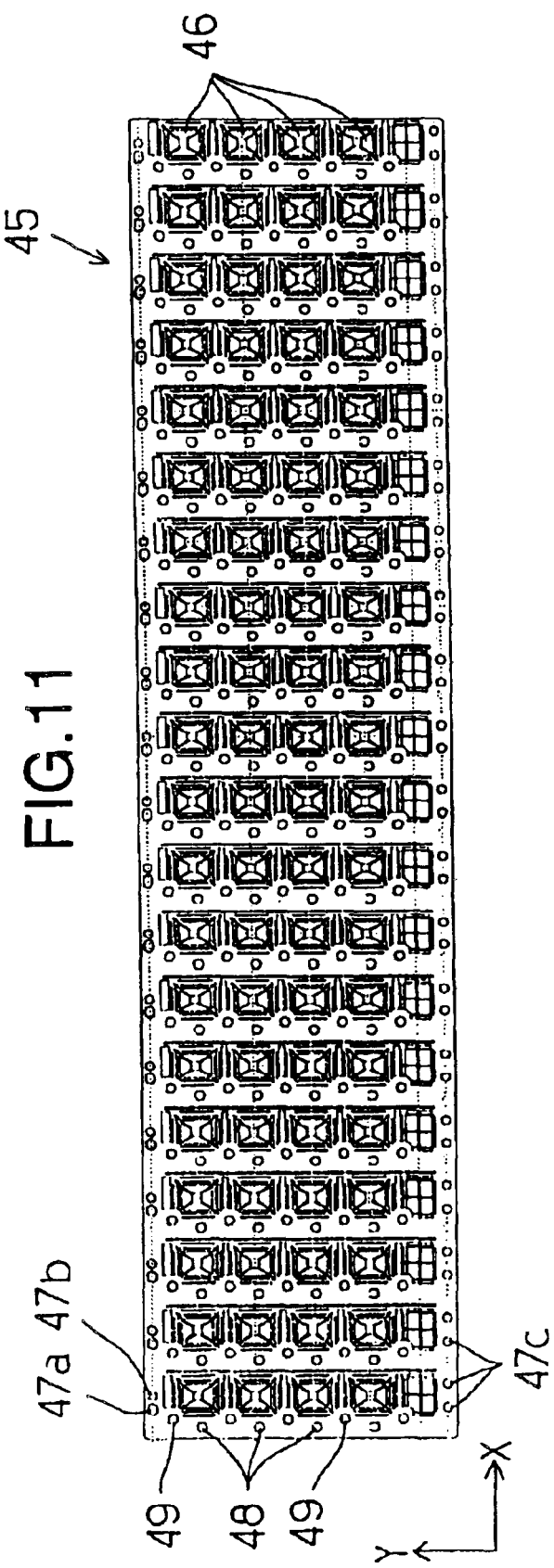
FIG. 11 is a plan view showing a lead frame used for fabricating the non-leaded semiconductor device according to the first embodiment of the invention.
Figure 12:
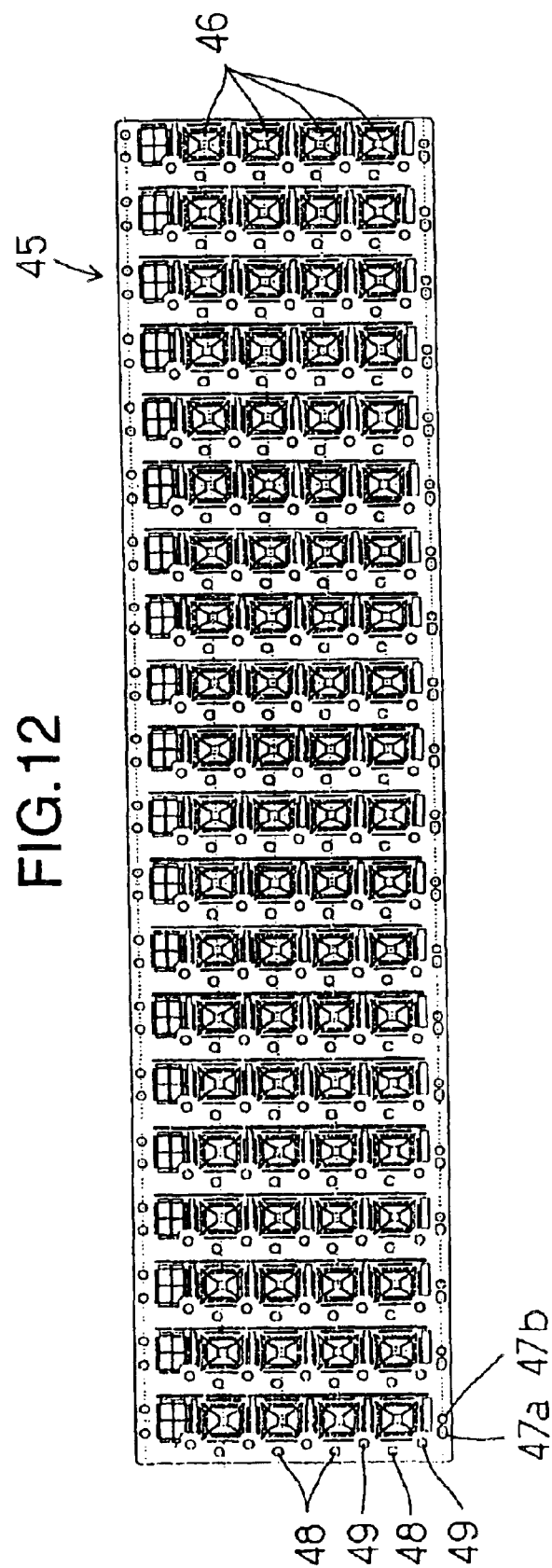
FIG. 12 is a bottom view showing the reverse surface of a lead frame used for fabricating the non-leaded semiconductor device according to the first embodiment of the invention.

First, the lead frame is formed. FIG. 11 is a plan view schematically showing the lead frame 45 having a matrix configuration used for fabricating the QFN semiconductor device 1 according to the first embodiment, and FIG. 12 a bottom view showing the reverse surface thereof.

This lead frame 45, as shown in FIG. 11, includes 20 rows of unit lead frame patterns 46 arranged in X direction and four columns of unit lead frame patterns 46 arranged in Y direction. A total of 80 semiconductor devices 1 can thus be fabricated from a single lead frame 45. Guide holes 47a to 47c used for conveyance, positioning, etc. of the lead frame 45 are formed on the two sides of the lead frame 45. At the time of transfer molding, a runner is located on the left side of each line.

A runner is located on the left side of each column at the time of transfer molding. In order to separate forcibly the runner set resin from the lead frame 45 by projecting ejector pins, ejector pin holes 48 through which the ejector pins can pass are formed. Also, in order to forcibly separate, by projecting the ejector pins, the gate set resin branching from the runners and flowing in the cavity and hardened in the gate portion, ejector pin holes 49 through which the ejector pins can pass are formed.

Figure 13:
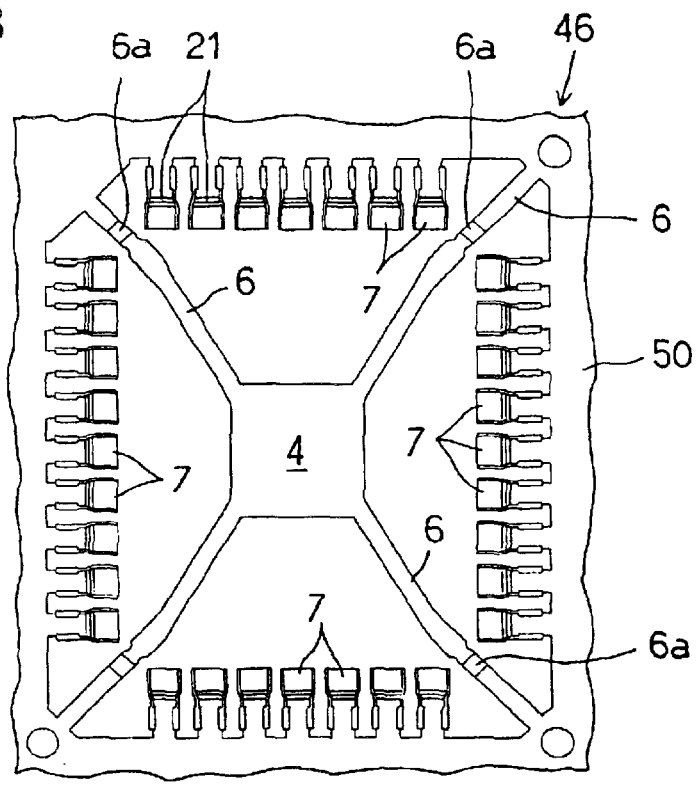
FIG. 13 is a plan view showing a part of the unit lead pattern of the lead frame.
Figure 14:
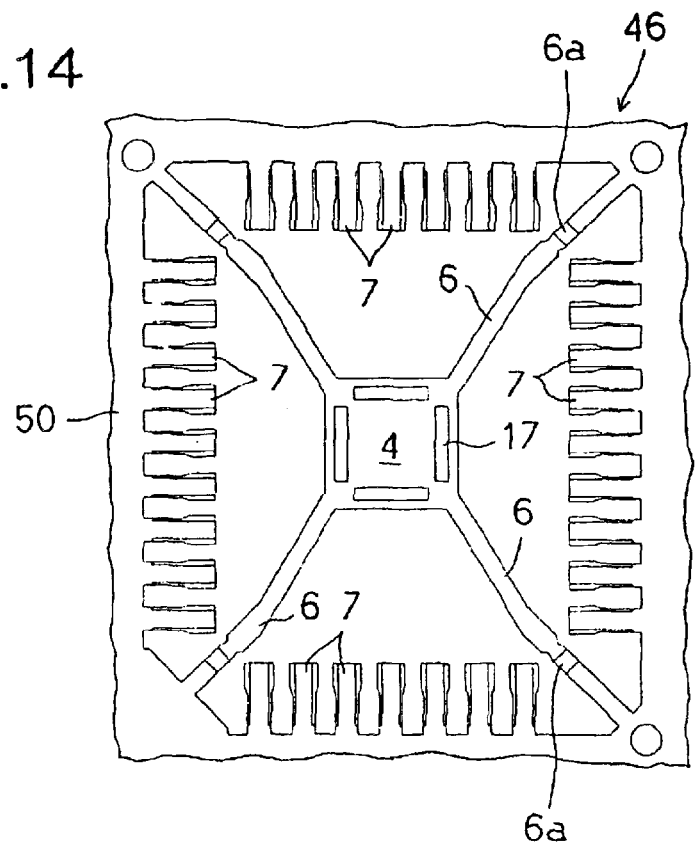
FIG. 14 is a bottom view showing the reverse surface of the unit lead frame pattern.

FIG. 13 is a plan view showing a part of the unit lead frame pattern 46, and FIG. 14 a bottom view showing the reverse surface thereof. The unit lead frame pattern 46 has a rectangular frame portion 50. The tab suspension leads 6 extend from the four corners of the frame portion 50 and form a pattern for supporting the tab 4 at the central portion. The tab suspension leads 6 are each bent outward by one step at the intermediate part thereof (bent portion 6a) by the extrusion molding. As a result, the surface of the tab 4 supported by the tab suspension leads 6 on which the semiconductor element is fixed provides a projected surface.

A plurality of the leads 7 are extended inward from the inner part of each side of the frame portion 50, and each have an inner end thereof located in proximity to the outer peripheral edge of the tab 4. As shown in FIG. 13, the leads 7 have the inverted trapezoid-like section as described above. Also, a groove 21 is formed in the upper surface of each of the leads 7. Though not shown, a plating film is formed on the inner end surface of each lead 7 at a position nearer to the tab 4 than the groove 21. FIG. 15(a) is a perspective view showing the lead 7 extending from the frame portion 50, and FIGS. 15(b) to 15(d) are sectional views of the lead taken along the lines A–A', B–B' and C–C', respectively, in FIG. 15(a). The structure of the lead 7 is described in detail already with reference to FIG. 4 and therefore will not be described further. The semiconductor element fixing surface of the tab 4 is also formed with a plating film not shown in order to fix the semiconductor element.

Figure 16:
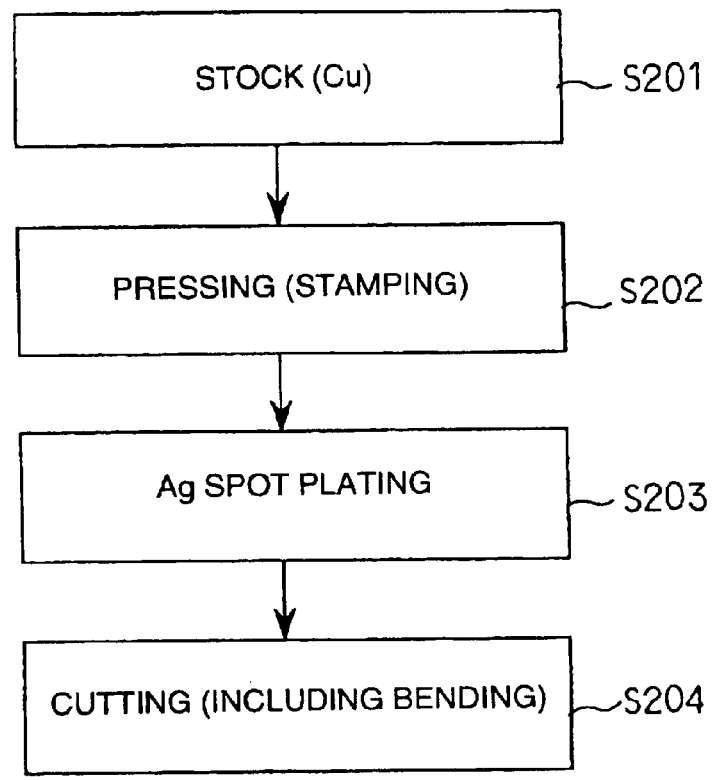
FIG. 16 is a flowchart showing the steps of fabricating the lead frame.

This lead frame 45 is fabricated in such a manner that a thin metal sheet such as a hooped material (copper sheet) wound on a reel is supplied and moved intermittently through a press while at the same time being subjected to the appropriate machining operation at the machining stations in the sequential-feed press. FIG. 16 is a flowchart showing the steps for fabrication of the lead frame in the sequential-feed press. After preparing a stock (Cu) (S201), the stock is stamped in the sequential-feed press to form the unit lead frame patterns (S202), and then Ag is spot plated (S203). As the next step, the tab suspension leads 6 are bent by extrusion molding, and the stock is cut into pieces of predetermined length thereby to form the lead frame 45 shown in FIGS. 11 and 12.

Figure 17:
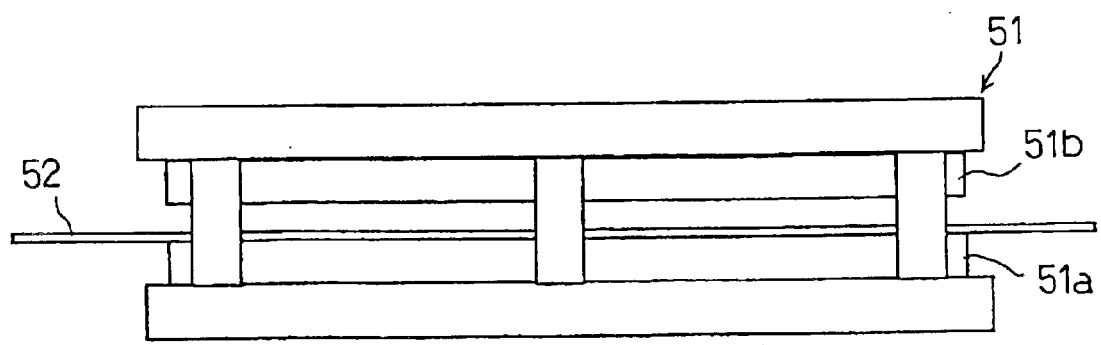
FIG. 17 is a schematic diagram showing a part of the sequential press for fabricating the lead frame.
Figure 18:
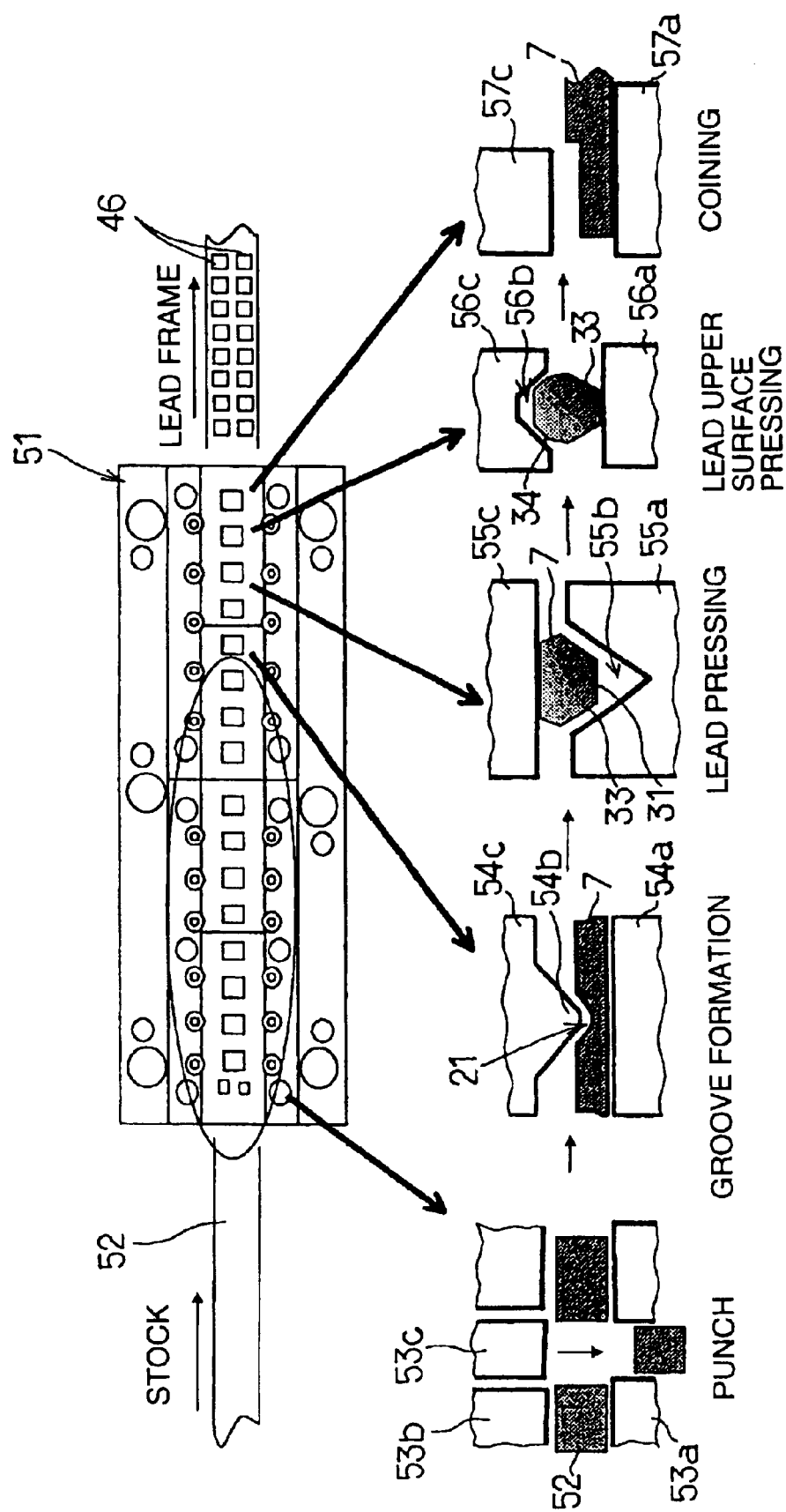
FIG. 18 is a schematic diagram showing the manner in which the stamping process is conducted in the sequential press.

FIG. 17 is a schematic diagram showing a part of the die for the sequential-feed press, and FIG. 18 is a schematic diagram showing the stamping steps in the sequential-feed press, i.e. the steps of forming patterns by punching, pressing the leads, etc.

As shown in FIG. 17, the press die 61 is configured of a lower die 51a and an upper die 51b, between which the hooped material (stock) 52 is intermittently moved from left to right, for example. Each time the hooped material is stopped, the lower die 51a and the upper die 51b are fastened while at the same time performing a predetermined step of the stamping.

Now, the stamping steps sequentially conducted along the direction in which the hooped material 52 moves will be explained. In FIG. 18, the punch work is performed sequentially in a plurality of machining stations to form not only the leads but also the tab and the tab suspension leads. This punch work, as shown at the lower left part of FIG. 18, is so performed that the hooped material 52 placed on the die 53a is held by a stripper 53b and the punch 53c is fallen. This selective punching step is repeated thereby to form a unit lead frame pattern.

Figure 19:
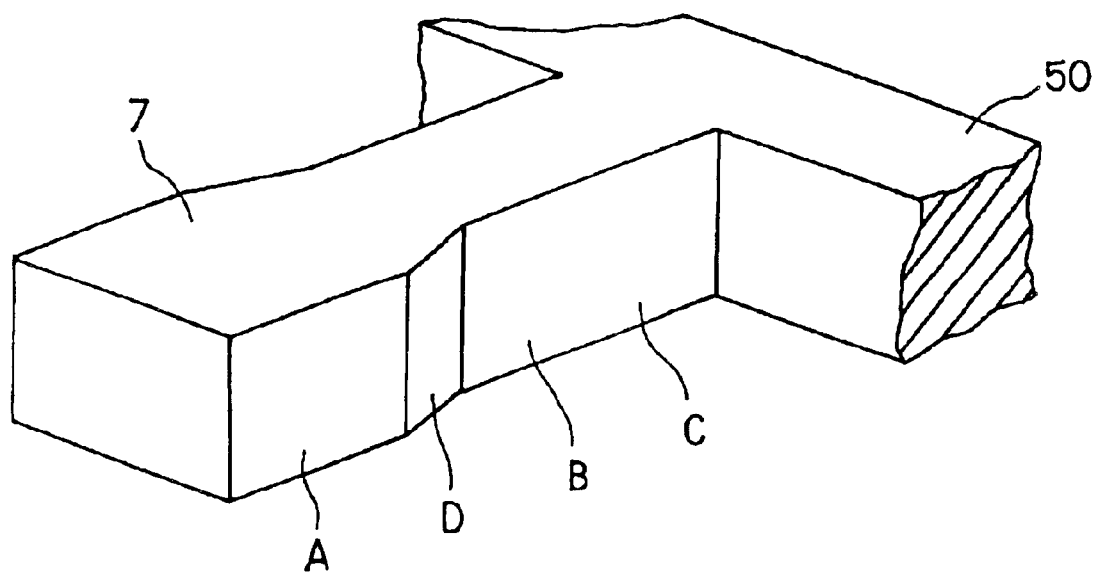
FIG. 19 is a perspective view showing the lead portion before the pressing process, formed by the lead punching process performed in the sequential press.
Figure 21:
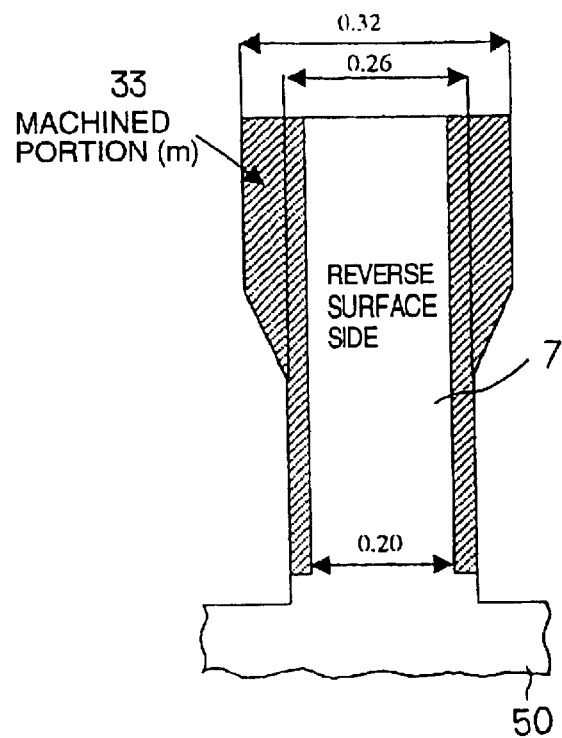
FIG. 21 is a bottom view showing the lead portion before the pressing process, formed by the lead punching process in the sequential press.

FIG. 19 is a perspective view showing the lead 7 formed by this punch work. The lead 7 is so configured that the upper and lower surfaces thereof have the same width. The lead 7, however, includes a basic structure for forming the portion A (A), the portion D (D), the portion B (B) and the portion C (C). Specifically, the portion A (A) has a large width, the portion B (B) and the portion C (C) are straight in shape and have a narrower width than the portion A (A), and the portion D (D) is tapered for connecting the portion A (A) and the portion B (B) to each other.

In the next step, grooves are formed. In this groove forming step, as shown in FIGS. 18 and 20(b), the lead 7 placed on the die 54a is coined by a punch 54c having a V-shaped ridge 54b thereby to form a groove 21 in the upper surface of the lead 7. In similar manner, a groove 17 can be formed in the lower surface of the tab 4. In this way, the lead 7 is formed with a groove in the portion D (D) thereof, as shown in FIG. 20(a).

Figure 22:
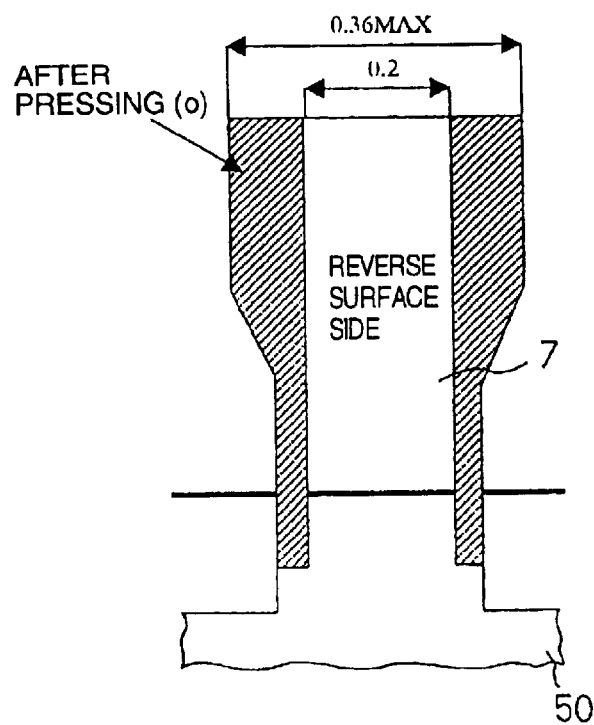
FIG. 22 is a bottom view showing the lead portion formed by the lead pressing process in the sequential press.

Then, the lead pressing process is performed. In this lead pressing process, as shown in FIG. 18, the lead 7 is placed in the V-shaped groove 55b of the die 55a, and pressed by the punch 55c having a flat lower surface. By this pressing process, the lead 7 shown in FIG. 21 develops an expansion (p) so that the width of the part just below the lower surface thereof becomes slightly larger, as shown in FIG. 22. This pressing process forms the side surfaces 33 on the two side edges of the lower surface 31 of the lead 7. The side surfaces 33 are formed in the same manner for the portion A (A), the portion D (D), the portion B (B) and the portion C (C). Since the portions A to C have different values of the lead width before the pressing process, however, the portions A, B and C have different lead width g and different height f after the pressing process. Further, the portion D formed with the grooves comes to assume a different shape from the other portions (portions A to C). The opening angle of the V-shaped groove 55b is, for example, 60 degrees, and so are the opening angles of the grooves of the portions A, B, C and D. The tapered side surfaces 33 of the portions A to D are formed in the same plane. Also, the difference in width for each portion leads to the difference of the height of the side surfaces 33 from one portion to another. Thus, the height is greater for the side surfaces 33 of the wide portion A, while the height of the side surfaces 33 is smaller for the narrow portions C and D.

As described above, the lead 7 is machined into a tapered form for all the portions having different width using the groove 55b having the same angle. In this way, as compared with the case in which the lead 7 is machined into a tapered form partially or different portions of the lead 7 are formed with different taper angles, the flatness of the lead, or especially, the bottom portion 31 of the lead providing the electrodes can be improved.

Figure 23:
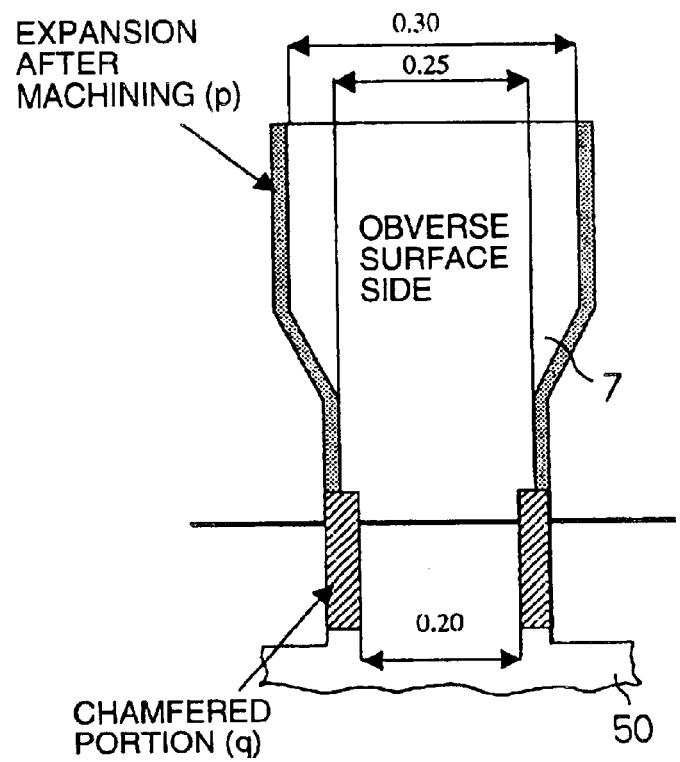
FIG. 23 is a plan view showing the lead portion formed by pressing the upper surface of the lead by the sequential press.

Then, the lead 7 is pressed again. In this secondary pressing process, as shown in FIG. 18, the lead 7 is placed on the die 56a having a flat upper surface, and while being positioned in the V-shaped groove 56b, pressed by the punch 56c having the lower surface thereof formed with the V-shaped groove 56b (having the opening angle of 45 degrees). This pressing process forms the machined surfaces 34. By changing the shape of the groove of the punch 56c, the portion B (B) can also be pressed. A plan view of the lead 7 formed by the secondary pressing process is shown in FIG. 23.

Figure 24:
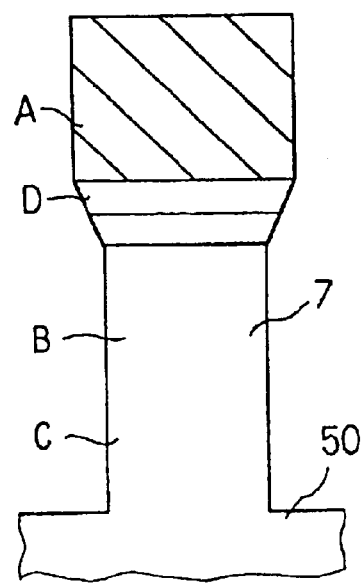
FIG. 24 is a plan view showing the lead portion coined by stamping.
Figure 25:
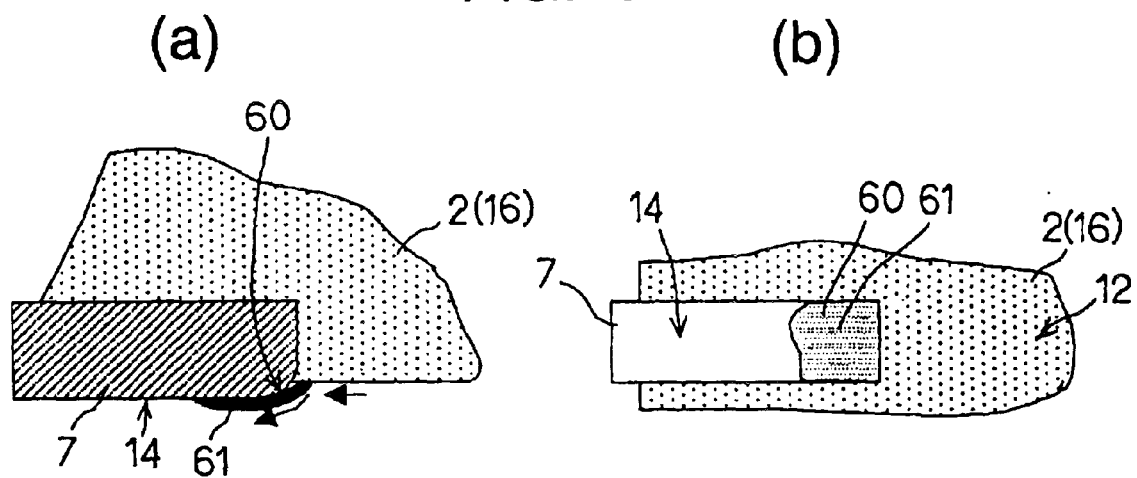
FIG. 25 is a schematic diagram for explaining a defect generated with the lead edge exposed to the mounting surface of the seal member rounded by the punching process in press.

Then, as shown in FIG. 18, the forward end of the lead, etc. is coined by the die 57a having a flat upper surface and the punch 57c having a flat lower surface. Thus, the protrusions and the roundings (dull) of the punched edge formed by the punching process are flattened. FIG. 24 shows the manner in which the forward end portion of the lead 7 is flattened from the upper surface thereof. The hatched area indicates the portion coined for flattening.

The portions requiring the flattening process will be briefly explained. FIGS. 25(a), 25(b) show a structure in which the mounting surface 14 of the lead 7 is exposed to the mounting surface 12 of the package 2. Assume that the punched edge has a rounding (dull) 60. In view of the fact that the resin component 61 of the seal resin 16 making up the package 2 has a dull 60, the phenomenon of what is called the resin flush in which the resin component 61 flows out to the mounting surface (lower surface) 14 of the lead 7 occurs at the time of molding the package 2. The flowout and attachment of the resin component 61 deteriorates the solder wettability for packaging, and therefore the deflush work is required for removing the resin component 61. According to the first embodiment of this invention, the phenomenon of resin flush can be prevented by flattening the forward end portion of the lead 7.

Figure 26:
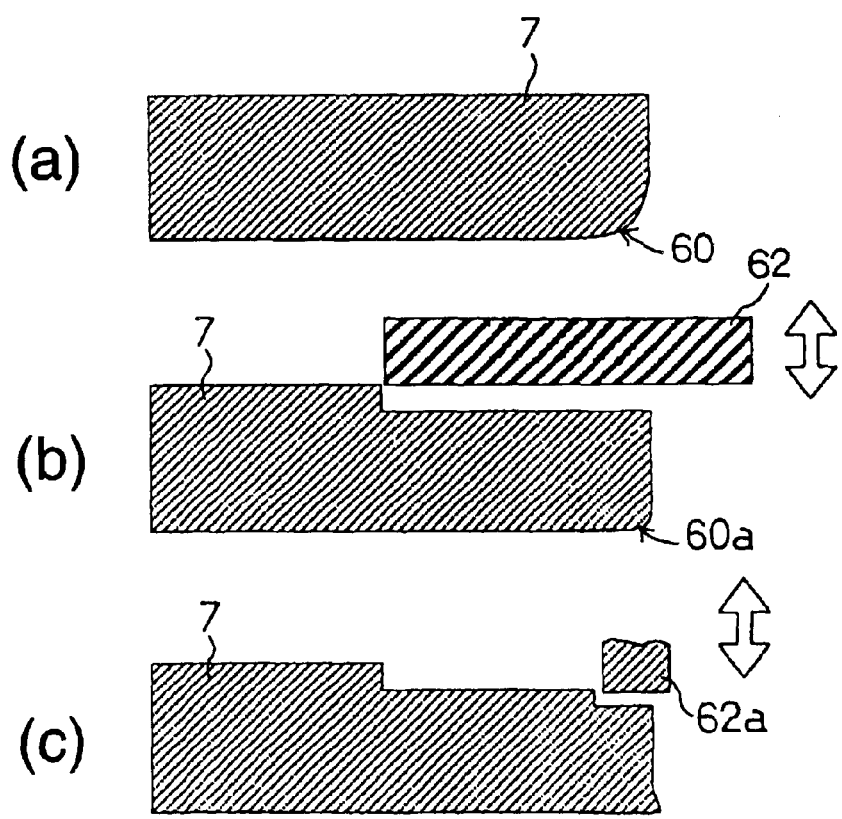
FIG. 26 is a diagram for explaining the process for flattening by correcting the protrusion and the rounding of the edge punched by the punching process in press.
Figure 27:
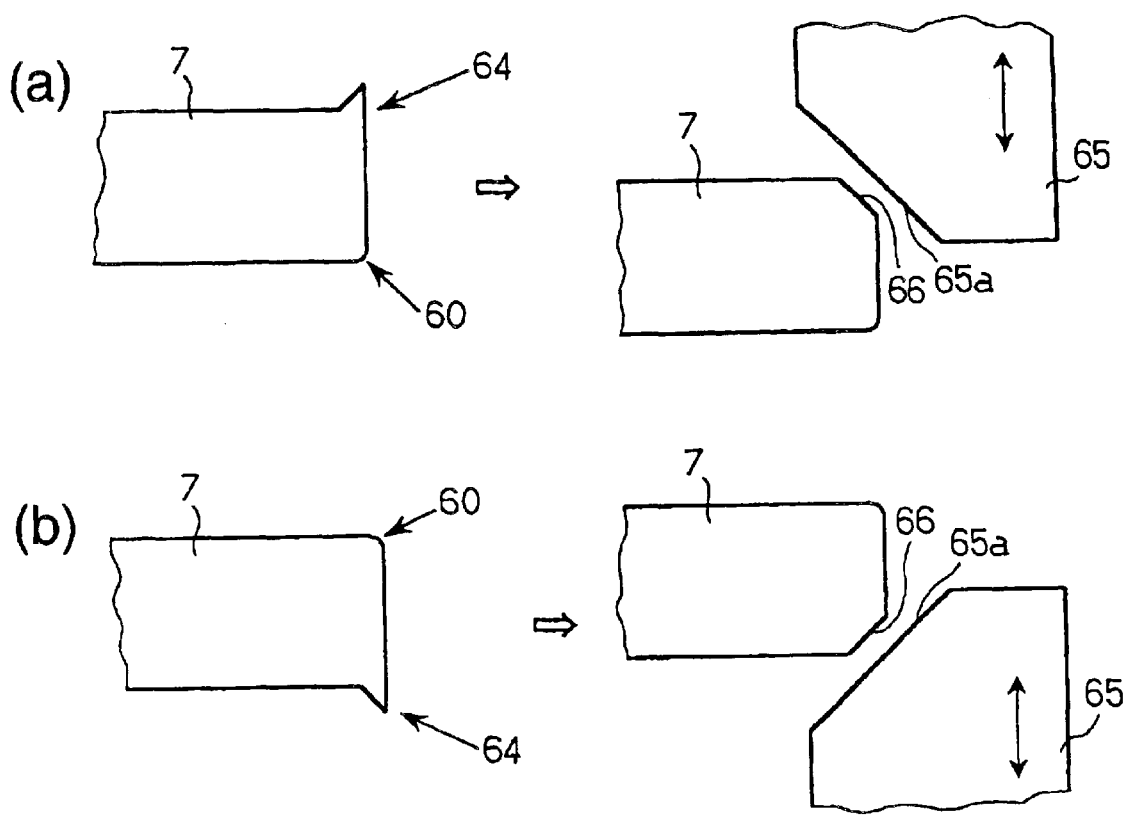
FIG. 27 is a diagram for explaining a method of correcting the protrusion and the rounding of the edge punched by the punching process in press.

FIG. 26 shows a method of flattening by coining the (rounding) dull 60 generated by the punching process. FIG. 26(a) is a diagram showing the lead portion of the lead frame, for example, with the lower surface of the forward end of the lead 7 developing a rounding (dull) 60. In other words, the lead frame is punched through upward from the lower surface to the upper surface.

In this case, as shown in FIG. 26(b), the lead 7 placed on the die not shown is coined by the punch 62 having a flat lower surface. By this coining process, the rounding (dull) 60 is changed to a dull 60a having a smaller rounding as shown in FIG. 26(b). If the dull 60a having this degree of rounding is free of troubles, the particular lead 7 is used as it is. Otherwise, the forward end portion of the lead 7 is machined locally by the punch 62a. As a result, the dull is completely removed.

FIGS. 27(a), (b) show a method of removing the protrusion (burr) 64 of the punched edge generated by the punching process. FIG. 27(a) is a schematic diagram showings the forward end portion of the lead 7, for example, punched through from the lower surface to the upper surface, and FIG. 27(b) is a schematic diagram showing the forward end portion of the lead 7 punched through from the upper surface toward the lower surface with a pressing die 65 for removing the particular burr.

The pressing die 65 has an inclined pressing surface 65a at one edge of the forward end portion thereof. In the case of FIG. 27(a), due to the presence of the protrusion (fin) 64 at the upper edge of the forward end portion of the lead 7, the pressing die 65 having the pressing surface 65a at the left edge of the lower surface thereof is moved downward and the protrusion 64 is pressed by the pressing surface 65a into a flat inclined corrected surface 66. As a result, the trouble which otherwise might be caused by the protrusion 64 is eliminated.

In similar fashion, in the case of FIG. 27(b), due to the presence of the protrusion (fin) 64 at the lower edge of the forward end portion of the lead 7, the pressing die 65 having the pressing surface 65a at the left edge of the upper surface thereof is moved upward so that the protrusion 64 is pressed by the pressing surface 65a into a flat inclined corrected surface 66. As a result, the trouble which otherwise might be caused by the protrusion 64 is eliminated.

In the lead frame fabricated in this first embodiment, the troublesome protrusion 64 and the rounding 60 generated by the coining, beating, pressing or punching process described above are corrected. This correcting process is carried out after the pressing process to eliminate the effect of the pressing process.

In the next step, though not shown, the Ag spot plating is conducted (S203). This spot plating is carried out in the surface of the tab 4 where the semiconductor element is fixed and the wire bonding area of each lead 7 for connecting the wire.

Then, though not shown, the cutting process (including the bending process) is carried out (S204). In this step, the tab is raised by bending (extrusion stamping). In this extrusion stamping process, the upper surface of the lead frame for assembly is used as a lower surface, and under this condition, the portions including and connected to the tab 4 are formed by depressing the punch downward. After that, the hooped material (stock) 52 is cut into pieces of predetermined length thereby to fabricate the lead frame 45 as shown in FIG. 11.

Figure 28:
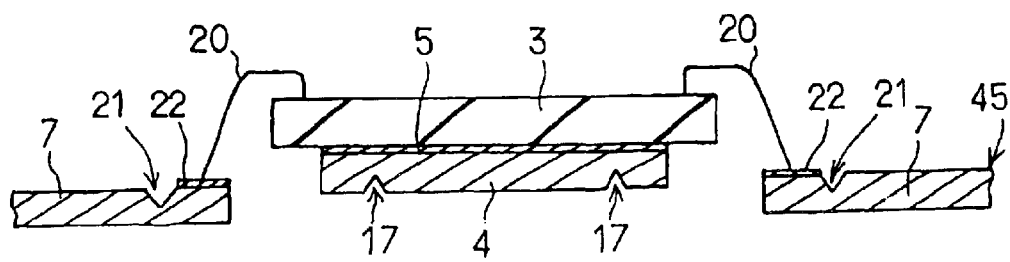
FIG. 28 is a partly enlarged sectional view showing a lead frame with a semiconductor placed on the main surface of the tab in fabricating a non-leaded semiconductor device according to the first embodiment of the invention.

In the case where the semiconductor device 1 is fabricated using the lead frame 45 in this manner, as shown in FIG. 28, the semiconductor chip 3 is fixed on the upper surface of the tab 4 using the adhesive 5 such as Ag paste (chip bonding: S102). After that, the electrode not shown in FIG. 28 which is formed on the upper surface of the semiconductor chip 3 is electrically connected by the conductive wire 20 to the upper surface of the portion of the lead 7 external to the groove 21 of the lead 7 (wire bonding: S103). The wire 20 is connected on the plating film 22. The plating film 22 is formed by Ag plating in the wire connection area, and therefore a high wire connection strength is achieved.

Figure 29:
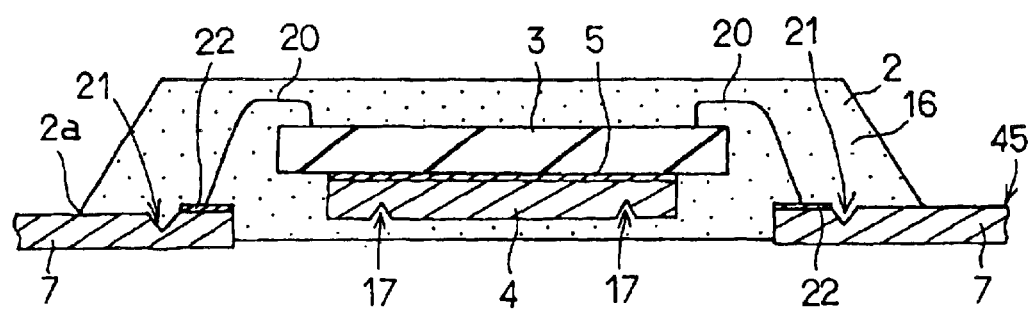
FIG. 29 is a partly enlarged sectional view showing a lead frame wire bonded and sealed with resin in fabricating a non-leaded semiconductor device according to the first embodiment of the invention.

Next, the normal one-side transfer molding is carried out in a predetermined area of the lead frame 45 thereby to form, as shown in FIG. 29, the package 2 configured of an insulative resin (mold: S104). Thus, the tab 4, the semiconductor chip 3 and the wires 20 are fully embedded in the package 2. The lower surface of each lead 7, on the other hand, is exposed from the lower surface 12 of the package 2. Though not shown, the lower surface of a part of each tab suspension lead 6 is also exposed from the lower surface 12 of the package 2. At the time of this molding process, a sheet is arranged on the lower surface of the lead frame and the package 2 is formed on the upper surface of the lead frame. As a result, the mounting surface 12 of the package 2 is depressed from the mounting surface 14 providing the lower surface 31 of the lead 7.

The resin component of the seal resin 16 making up the package 2 which may be attached to the exposed surface of the leads 7 in the molding process described above is removed (deflush: S105). This deflush step is carried out, for example, by spraying water under high pressure to the surface of the leads 7 exposed from the mounting surface 12 of the package 2.

Then, a plating film is formed on the surface of the leads 7 in the form of a lead frame (S106). This plating film is comprised of, say, PbSn solder (FIG. 6(b)).

As the next step, though not shown, the marking process is carried out in which a predetermined mark is attached on the upper surface of the package 2 (S107).

Along the outer periphery of the package 2, the leads 7 and the tab suspension leads 6 or the seal resin 16 (resin fins 9) existing between the leads or between the leads 7 and the tab suspension leads 6 are cut off. In this way, the unrequired lead frame portion is removed thereby to fabricate the semiconductor device 1 as shown in FIGS. 1 to 3. In this case, the cutting process is carried out from the lower to upper surface side of the lead frame 45. As a result, the lower surface of the outer edge of each lead 7 exposed to the lower surface of the package 2 of the semiconductor device 1 comes to assume a roundish form, so that no inconvenience occurs which otherwise might be caused by the cutting edge at the time of packaging.

An electronic apparatus is fabricated by mounting this semiconductor device 1 on the packaging board. In fabricating the electronic apparatus, a packaging board (wiring board) 40 is prepared which has electrodes (lands) 41 at positions in opposed relation to the leads 7, respectively, exposed to the mounting surface side of the seal member 2 of the semiconductor device 1, after which the lands 41 on the package board 40 and a plurality of the leads 7 are set in opposed relation to each other through solder paste and heat treated. Thus, the solder paste is fused so that the leads 7 and the lands 41 on the packaging board 40 are electrically connected to each other by the coupling material 42 comprised of the solder paste. As a result, the electronic apparatus shown in FIGS. 8 and 9 is fabricated.

The first embodiment of the invention has the following effects.

(1) At least a part of the leads 7 incorporated in the seal member 2 has an inverted trapezoid-like section 30, and the two side edges of the upper surface 32 embedded in the seal member 2 of the inverted trapezoid-like section 30 are formed with flat machined surfaces 34, respectively, formed by the pressing process. This pressing process widens the interval between the adjacent leads 7 and thus increases the strength (terminal strength) by which the seal resin 16 holds the leads 7.

(2) The fact that the inverted trapezoid-like section 30 has the machined surfaces 34 can widen the interval between adjacent leads 7. Thus, assuming that the terminal strength depending on the interval between adjacent leads 7 is constant, the pitch of the leads can be reduced. As a result, the non-leaded semiconductor device can be reduced in size.

(3) In the inverted trapezoid-like section 30, the length (width) between the point at which the machined surface 34 on one side joins the side surface 33 on one side and the point at which the machined surface 34 on the other side joins the side surface 33 on the other side is longest. The width of the upper surface 32 is next longest, and the width of the lower surface 31 is shortest. For this reason, it becomes more difficult for the leads 7 to come off from the mounting surface 12 of the seal member 2 and the terminal strength is increased.

(4) The lead portion projected from the side surface 33 of the seal member 2 has the inverted trapezoid-like section 30 having the machined surfaces 34, and the width of the upper surface 32 of the inverted trapezoid-like section 30 and the width of the lower surface 31 thereof are equal or very approximate to each other. Even in the case where the plating film 24 is formed on the surface of the leads and the surface of the leads is pressed and projected toward the two sides by stamping, therefore, the shorting between the leads attributable to the projection of the plating film can be prevented without reducing the interval between adjacent leads as compared with the structure in which the width of the upper surface is largest like the inverted trapezoidal section 38.

(5) Each lead 7 includes a plurality of portions having inverted trapezoid-like sections having different widths of the upper surface 32. Therefore, the boundary portions between the different inverted trapezoid-like sections have a step or an unevenness thereby making it possible for the leads 7 to come off in the direction in which they extend.

(6) Along the direction in which the leads 7 extend, there are a plurality of the inverted trapezoid-like sections 30 having different boundary heights from the lower surface 31 of the inverted trapezoid-like section 30 to the point where each tapered side surface 33 joins the inversely-tapered machined surface 34. In view of this, the boundary portions between the different inverted trapezoid-like sections 30 have a step, and therefore the leads 7 can be prevented from coming off along the direction in which they extend. Also, as shown by the two continuous inverted trapezoid-like sections 30, the boundary height f thereof should better be different but not kept at the same numerical value. By so doing, the leads are "caught" to a greater degree by the force along the direction in which they extend, and therefore the tensile strength is increased for an increased strength of the leads (terminals). As a result, the reliability is improved.

(7) The width of at least a portion of each lead located in the seal member 2 is larger than the width of the lead portion projected from the side surface of the seal member 2. As a result, the leads 7 are prevented from coming off along the direction in which they extend.

(8) The groove 21 is formed in the surface of each lead 7 and filled with the seal resin 16 making up the seal member 2. Therefore, the lead 7 and the seal resin 16 are more closely attached to each other and the terminal strength can be improved. Also, the presence of the groove 21 lengthens the path of the water transmitted from the peripheral surface of the package along the surface of the lead 7 and entering the interior, thereby making it possible to suppress the corrosion of the wire 20 connected to the lead 7 which otherwise might be caused by water.

(9) The leads 7, the tab 4 and the tab suspension leads 6 are formed by stamping for punching through from the lower surface to the upper surface. The protrusion 64 and the rounding 60 at the punched edge generated by the punching process are flattened by stamping. Thus, the problem is overcome which otherwise might be posed by the protrusion 64 or the rounding 60 generated by punching. With the structure in which the lower surface 31 of each lead 7 is exposed to the mounting surface 12 of the seal member 2, for example, the exposed surface of the lead 7 is not contaminated (flushing failure) by the resin component flowing out from the seal resin at the time of molding for forming the seal member 2.

(10) In the structure in which each tab suspension lead 6 is bent inward of the seal member 2 at an intermediate point thereof and the tab 4 is embedded in the seal member, assume that the grooves 17 are formed in the reverse surface of the tab 4. In view of the fact that the seal resin 16 making up the seal member 2 is filled in the grooves, the tab 4 and the seal resin 16 are more closely attached to each other, thereby making it difficult to cause the failure of close contact between the tab 4 and the seal resin 16 which otherwise might be caused by the heat at the time of packaging the semiconductor device 1.

(11) The forward end surface of each lead 7 projected from the side surface of the seal member 2 is aligned with the forward end surface of the resin filled between the particular lead 7 and an adjacent lead 7, and the forward end surface of a tab suspension lead 6 projected from the side surface of the seal member 2 is aligned with the forward end surface of the resin filled between the particular tab suspension lead 6 and an adjacent lead 7. Therefore, the shorting hardly occurs between the leads which otherwise might be caused by the coupling material such as solder at the time of packaging.

(12) In view of the fact that the leads 7 are prevented from coming off from the seal member 2 and that the tab 4 and the seal resin 16 are prevented from being separated from each other, the structure according to the invention can improve the fabrication yield and thus the production cost of the semiconductor device 1 can be reduced.

(13) The semiconductor device 1 is molded by the method using a sheet, and therefore the lower surface 12 of the package 2 is depressed (offset) from the lower surface 31 of the leads 7. This offset structure has the advantage of superior packaging with solder in view of the fact that the wet area of the solder is specified for the surface packaging of the semiconductor device 1 on the wiring board such as a packaging board.

(14) After forming the inverted trapezoid-like section 30 by pressing the leads 7, the coining process is performed for eliminating the dull 60 and the protrusion 64 at the forward end portion of each lead 7. As a result, the effect of flattening by coining the lead 7 is sustained thereafter desirably for the assembly work of the semiconductor device 1.

(15) After the V-shaped groove forming process for forming the groove 21 in the upper surface of the lead 7 or the grooves 17 in the lower surface of the tab 4, the coining process is carried out for eliminating the dull 60 and the protrusion 64 at the forward end portion of the lead 7. As a result, the flattening effect of coining of the lead 7 is sustained thereafter desirably for the assembly work of the semiconductor device 1.

(16) The tab raising process is carried out after the process for forming the unit lead frame patterns 46 including the pressing process. Therefore, the dimensional accuracy of the tab raising process is sustained thereafter desirably for the assembly of the semiconductor device 1.

(17) In an electronic apparatus having the semiconductor device 1 according to the invention built in the mounting board 40, the leads 7 are not easily separated from the package 2. Therefore, an inconvenience rarely occurs in which the leads 7 come off from the package 2 and the semiconductor device 1 is separated from the packaging board 40 under a small external force. Thus, the reliability is improved.

(Second Embodiment)

Figure 30:
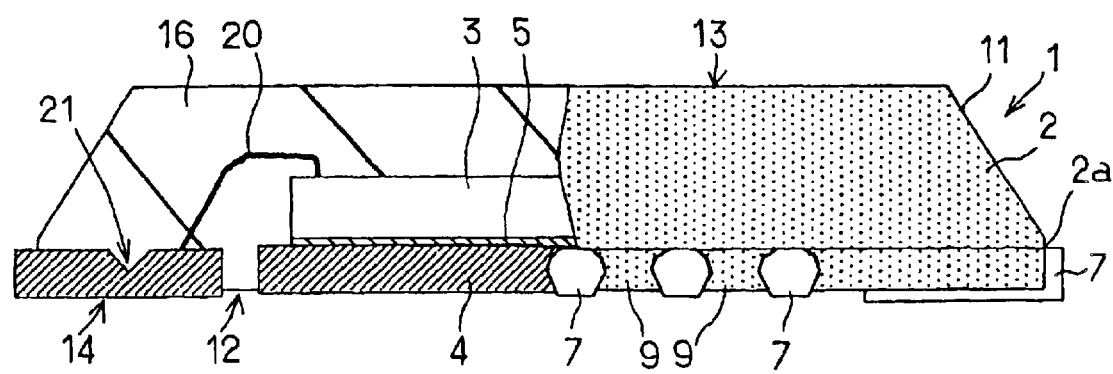
FIG. 30 is a sectional view schematically showing a non-leaded semiconductor device according to another embodiment (second embodiment) of the invention.

FIG. 30 is a sectional view schematically showing a non-leaded semiconductor device according to another embodiment (second embodiment) of the invention. According to the second embodiment, the semiconductor device 1 is fabricated using a flat lead frame with the tab suspension leads 6 not bent. As a result, the lower surface 31 (the mounting surface 14) of each lead 7 is exposed from the mounting surface 12 providing the lower surface of the package 2. This structure has the advantage that the height of the package 2 can be reduced and that the heat generated in the semiconductor chip 3 can be rapidly released to the packaging board through the tab 4.

(Third Embodiment)

FIGS. 31 and 32 are diagrams showing a non-leaded semiconductor device according to still another embodiment (third embodiment) of the invention. FIG. 31 is a plan view showing a lead of the lead frame used for fabricating the semiconductor device. FIG. 32 is sectional views taken in lines A–A', B–B' and C–C' in FIG. 31.

In this third embodiment, like in the first embodiment described above, the lead 7 is configured of a portion A (A), a portion D (D), a portion B (B) and a portion C (C), as shown in FIG. 31. These portions have different cross sections from those of the first embodiment as shown in FIG. 32. FIG. 32 shows the cross sections of the lead at the portion A (A), the portion B (B) and the portion (C). As seen from these sectional views, the lead 7 according to this third embodiment has sectional structures as shown in FIGS. 32(*a*) to 32(*c*) by using a flat die in place of the pressing die.

This structure, as compared with the first and second embodiments, has the advantage that the effect of suppressing the lead separation is increased by the pressing process.

(Fourth Embodiment)

Figure 33:
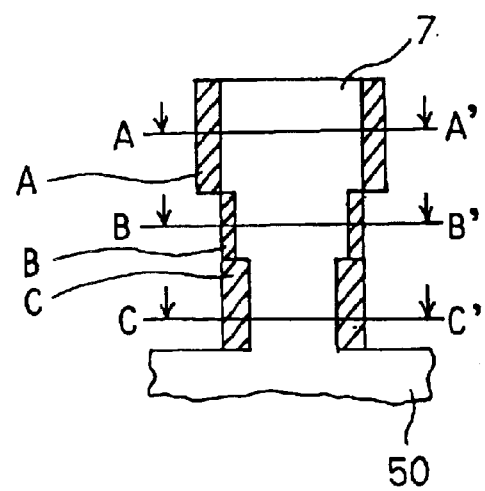
FIG. 33 is a plan view showing the lead portion of a lead frame used in fabricating a non-leaded semiconductor device according to yet another embodiment (fourth embodiment) of the invention.
Figure 34:
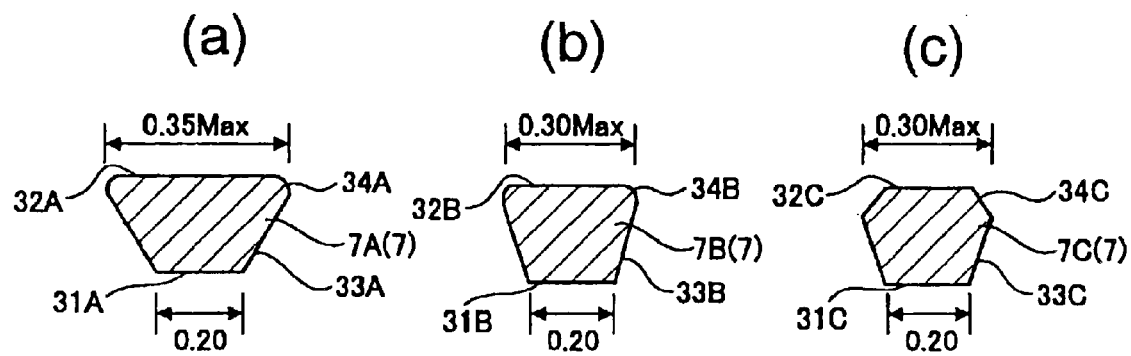
FIG. 34 is sectional views taken in lines A–A', B–B' and C–C', respectively, in FIG. 33.

FIGS. 33 and 34 are diagrams showing a non-leaded semiconductor device according to yet another embodiment (fourth embodiment) of the invention, in which FIG. 33 is a plan view showing a lead of the lead frame used for fabricating the semiconductor device, and FIG. 34 is sectional views taken in lines A–A', B–B' and C–C' in FIG. 33.

In this fourth embodiment, unlike in the first embodiment described above, the lead 7 lacks the portion D (D) and is configured of the portion A (A), the portion B (B) and the portion C (C), as shown in FIG. 33. The cross sections of the portion A (A), the portion B (B) and the portion C (C), like those of the first embodiment, are such that the two side edge portions of the upper surface 32 of the inverted trapezoid-like section 30 each have a flat surface or an arcuate surface formed by the pressing process. The machined surfaces of the portion A (A) and the portion B (B) are arcuate, and the machined surfaces 34 of the portion C (C) are flat.

This fourth embodiment has similar effects to the first embodiment.

(Fifth Embodiment)

Figure 35:
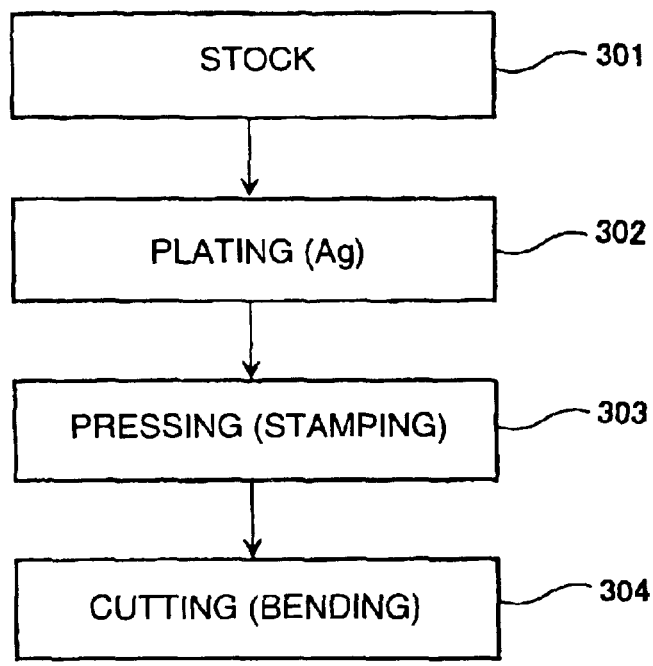
FIG. 35 is a flowchart showing the steps of fabricating a lead frame used in fabricating the non-leaded semiconductor device according to a further embodiment (fifth embodiment) of the invention.

FIG. 35 relates to the fabrication of a non-leaded semiconductor device according to a further embodiment (fifth embodiment) of the invention, and is a flowchart showing the fabrication steps of the lead frame.

According to the first embodiment, the lead frame 45 is fabricated by preparing a stock (Cu) (S301), after which Ag is spot plated (S302), and unit lead frame patterns are formed by press work (stamping) (S303), followed by extrusion bending each tab suspension lead 6 while at the same time cutting it to a predetermined length.

In the first embodiment, the stamping process including the punching process and the pressing process is conducted after plating, and therefore the plating film is not formed on the side surfaces of the tab 4. In the presence of the plating film on the side surfaces of the tab 4, the seal resin 16 would be attached less closely, and the problem of a package crack or the like is posed in the reliability test. According to this embodiment, in contrast, such a problem is obviated.

(Sixth Embodiment)

Figure 36:
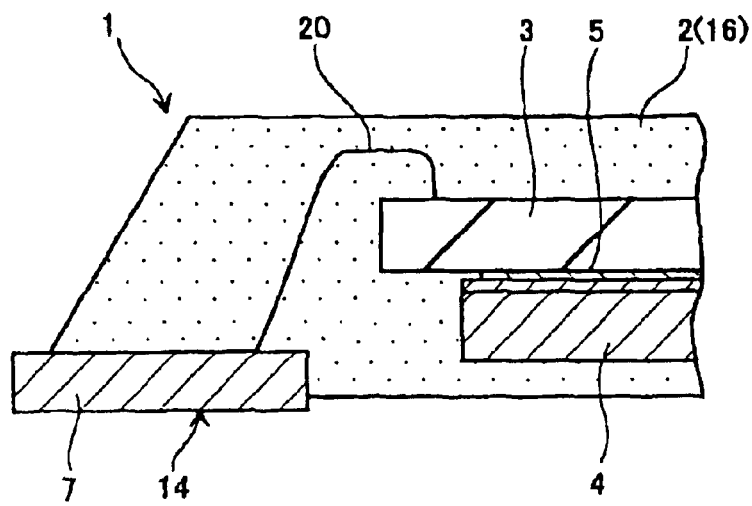
FIG. 36 is a partial sectional view showing a non-leaded semiconductor device according to still another embodiment (sixth embodiment) of the invention.

FIG. 36 is a sectional view showing a part of the non-leaded semiconductor device according to a still further embodiment (sixth embodiment) of the invention. According to the sixth embodiment, the tab 4 is small in size as compared with the semiconductor chip 3, so that the contact area between the semiconductor chip 3 and the tab 4 is reduced. As a result, the adhesive for bonding the semiconductor chip 3 and the tab 4 to each other contains no great amount of water, thereby making it difficult to cause the separation by explosion which otherwise might occur due to the bulging of water at the time of packaging the semiconductor device 1.

(Seventh Embodiment)

FIG. 37 is a partly enlarged sectional view showing the non-leaded semiconductor device according to a yet further embodiment (seventh embodiment) of the invention.

According to the seventh embodiment, each lead 7 is formed in octagon (polygon). The seventh embodiment has a similar effect to the first embodiment described above.

(Eighth Embodiment)

FIGS. 41 to 46 are diagrams relating to the fabrication of a non-leaded semiconductor device according to still another embodiment (eighth embodiment) of the invention.

The eighth embodiment relates to a fabrication method by which resin can be prevented from attaching on the surface of the tab suspension leads exposed to the mounting surface of the package.

The tab suspension lead is bent by one step at an intermediate point thereof by the extrusion molding process. In the case where this bent portion forms a curve, resin would circumvent under the curved surface (under the mounting surface) of the tab suspension lead and form what is called a resin flush at the time of resin molding for forming a package. This resin flush would come off during the transportation of the non-leaded semiconductor device and being caught between the packaging board 40 and the non-leaded semiconductor device, often cause a packaging failure of the non-leaded semiconductor device having a small standoff. Also, the presence of the resin flush is undesirable in view of the fact that in the case where the mounting surface of the tab suspension lead is fixed on the land of the packaging board through a coupling member at the time of packaging the non-leaded semiconductor device, the area of the portion of the tab suspension lead exposed from the resin is reduced, thereby often resulting in a disconnection.

Figure 41:
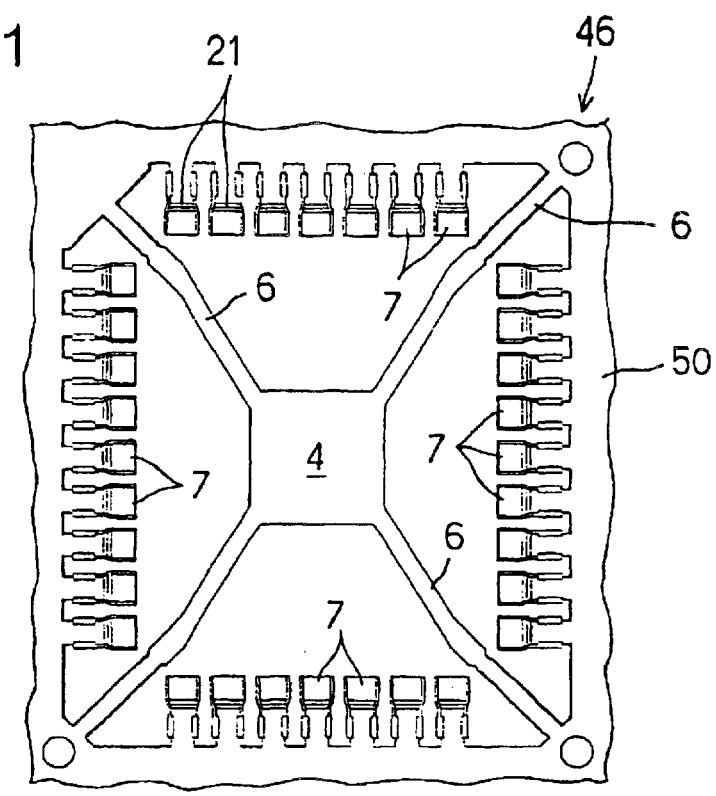
FIG. 41 is a plan view showing a part of the unit lead frame pattern of the lead frame used for fabricating the non-leaded semiconductor device according to still another embodiment (eighth embodiment) of the invention.
Figure 42:
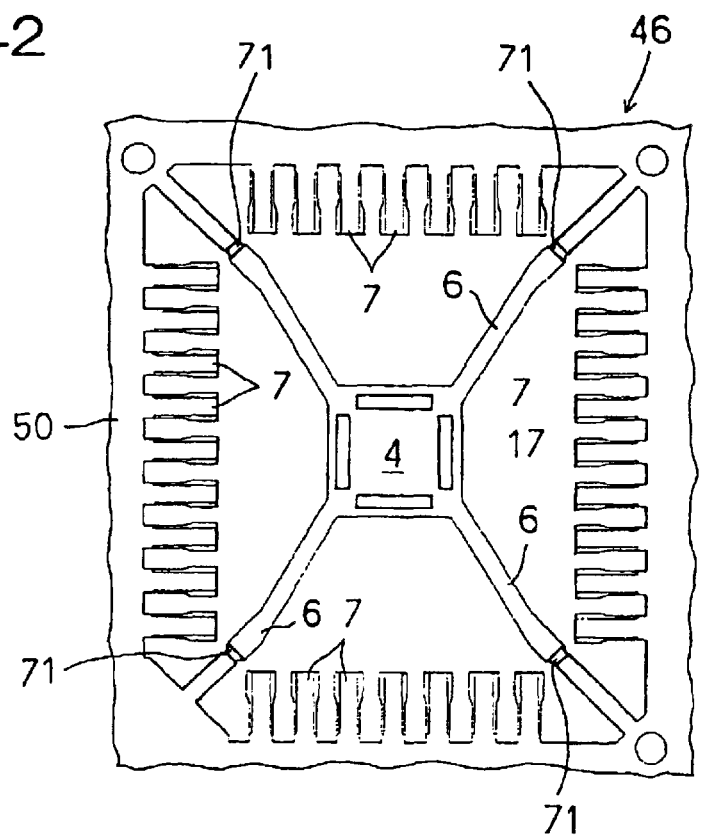
FIG. 42 is a bottom view showing the reverse surface of the unit lead frame pattern.

According to the eighth embodiment, a lead frame is used which has the unit lead frame pattern 46 as shown in FIGS. 41 and 42. FIG. 41 is a plan view showing a part of the unit lead frame patterns of the lead frame used for fabrication of a non-leaded semiconductor device, and FIG. 42 a bottom view showing the reverse surface of the unit lead frame pattern.

The unit lead frame pattern 46 shown in these diagrams is similar to the one shown in FIGS. 13 and 14 of the first embodiment, but the bent portion 6*a* is not yet formed. The feature of this eighth embodiment lies in that as shown in FIG. 42, a groove 71 is formed at the portion of each tab suspension tab 6 to be exposed and bent by extrusion molding on the reverse surface of the unit lead frame pattern 46, i.e. the mounting surface of the package. This groove 71 is formed transversely of the tab suspension lead 6. As shown in FIG. 42, the groove 71 is formed for each of the four tab suspension leads 6.

The groove 71, as shown in FIG. 43, is a V-shaped groove including a fixed surface 71*a* perpendicular to the reverse surface of the tab suspension lead 6 and a movable surface 71*b* formed nearer to the tab 4 and slanted at a predetermined angle to the reverse surface of the tab suspension lead 6. This V-shaped groove is formed, for example, by the grooving process shown in FIG. 20, and has an expansion at an angle of 60 degrees.

The tab suspension lead 6 of this lead frame is subjected to the process shown in FIGS. 43(*a*) to 43(*c*) sequentially. FIG. 43 is perspective views schematically showing the steps of processing the tab suspension lead portion of the unit lead frame pattern.

By the stamping process, as shown in FIG. 43(*a*), a rounding (dull) 72 is generated on the two sides of the reverse surface (the lower surface in the drawing) of the tab suspension lead 6. This stamping process is carried out also on the lead 7 as shown in FIG. 18.

Then, as shown in FIG. 43(*b*), the rounding (dull) 72 is removed by flat beating in the stamping process thereby to sharpen the edge so that the edges of the obverse and reverse surfaces of the tab suspension lead 6 are at right angles. In FIG. 43(*b*), the portions flattened by the flat beating process, i.e. the flat surfaces 73, 74 on the obverse and reverse sides are indicated by dots. The flattening process is carried out on a predetermined portion of the particular area on both sides of the groove 71. Under this condition, the groove 71 is maintained at the spread angle of 60 degrees. The flat beating process is preferably carried out over an area wider than the portion where the tab suspension lead is exposed, for example, inward of the groove 71 by about 0.5 mm and outward of the portion where the tab suspension lead is cut off to make sure that the portion where the tab suspension lead is exposed is positively covered.

Then, the tab suspension lead 6 is bent one step higher at a portion corresponding to the groove 71 by extrusion molding with stamping. As a result, the tab 4 supported by the tab suspension leads 6 can be embedded in the package. In this extrusion molding process, the fixed surface 71*a* making up the groove 71 remains unchanged as shown in FIG. 43(*c*), but the movable surface 71*b* is deformed in such a manner as to rotate about the bottom of the V-shaped groove. For example, the groove 71 is changed to have the bottom angle of about 90 degrees.

As described above, the flat surface 74 on the reverse surface on the fixed surface 71*a* side of the portion of the tab suspension lead 6 is not changed by the presence of the groove 71. Thus, in the case where the package 2 is formed by the one-side molding and the leads 7 and the tab suspension leads 6 are cut off, as shown in FIG. 44, the portion of each tab suspension lead 6 exposed to the mounting surface 12 of the package 2 of the tab suspension lead 6 is reduced in the radius of curvature of the edge thereof as shown in FIG. 45 so that no resin flush is formed.

Figure 44:
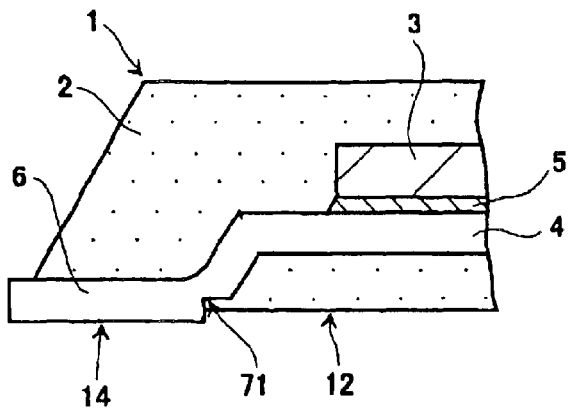
FIG. 44 is a sectional view showing a part of the non-leaded semiconductor device fabricated according to the eighth embodiment of the invention.
Figure 45:
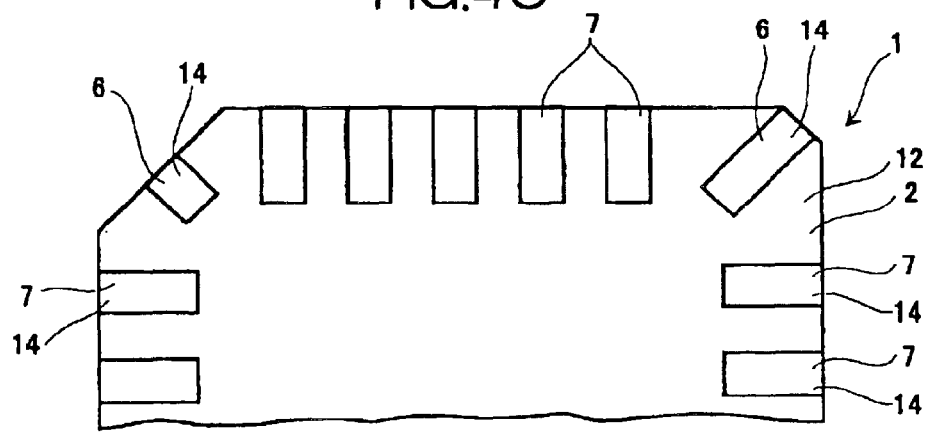
FIG. 45 is a bottom view showing a part of the non-leaded semiconductor device fabricated according to the eighth embodiment of the invention.

Specifically, it is seen from FIG. 44 showing a sectional view of the semiconductor device 1 that the edge of the portion of the tab suspension lead 6 which is exposed to the reverse surface of the package 2 is clearly projected (exposed) from the package 2.

According to the eighth embodiment, the package is formed by sheet molding, and therefore the mounting surface 14 of the tab suspension lead 6 is more projected than the mounting surface 12 of the package 2. With this structure, even in the case where foreign matter is attached to the mounting surface 12 of the package 2, no packaging failure occurs as long as the particular foreign matter is not so large.

Figure 46:
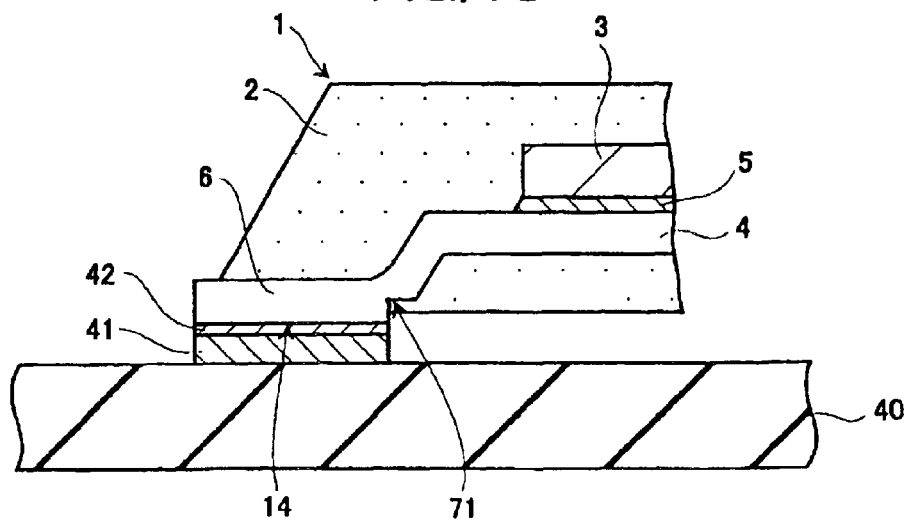
FIG. 46 is a partial sectional view showing the packaged state of the non-leaded semiconductor device fabricated according to the eighth embodiment of the invention.

FIG. 46 shows the semiconductor device 1 according to the eighth embodiment mounted on the packaging board 40. The mounting surface 14 providing the reverse surface of the tab suspension lead 6 projected (exposed) to the mounting surface 12 of the package 2 has the groove 71, is flattened by the flat beating process, and has no resin flush. Therefore, the mounting surface 14 can be positively connected to the electrodes (lands) 41 of the packaging board 40 through the coupling member 42.

The foregoing is a specific description of the embodiments of the invention achieved by the inventor. The present invention, however, is not limited to the embodiments described above but of course is variously modifiable without departing from the scope and spirit thereof.

The embodiments of the invention are described above with reference to an application to the fabrication of the QFN semiconductor device. Nevertheless, the invention is similarly applicable to the fabrication of, for example, the SON semiconductor device with equal effect.

The typical effects obtained by the embodiments of the invention disclosed in this specification will be briefly described. The invention is not limited to a configuration for achieving all the effects described herein but also includes a configuration for achieving part of the effects thereof.

(1) According to this invention, there is provided a non-leaded semiconductor device in which the strength of the external electrode terminal is high and the terminal has a high reliability, and a method of fabrication of such a semiconductor device.

(2) According to this invention, there is provided a method of fabricating an electronic apparatus having a high reliability of packaging the non-leaded semiconductor device.

INDUSTRIAL APPLICABILITY

As described above, a non-leaded semiconductor device according to this invention can be built in various types of electronic apparatuses. Also, the non-leaded semiconductor device according to this invention has a high strength of the external electrode terminal and a highly reliable terminal connection. The reliability of the electronic apparatus in which the non-leaded semiconductor device according to the invention is built can thus be improved.

What is claimed is:

1. A semiconductor device comprising:
   a seal member comprised of insulative resin;
   a tab sealed in said seal member;
   tab suspension leads exposed to a mounting surface of said seal member and connected to said tab;
   a plurality of leads exposed to the mounting surface of said seal member;
   a semiconductor element located in said seal member and fixed on one surface of said tab through an adhesive; and
   conductive wires for electrically connecting electrodes formed on the surface of said semiconductor element to said plurality of leads;
   wherein at least a lead portion of said plurality of leads have an inverted trapezoid-like section including an upper surface embedded in said seal member, a lower surface opposed to said upper surface and exposed from said seal member and side surfaces connecting two side edges of said upper surface and said lower surface, respectively, and
   the two side edges of said upper surface and said lower surface are each formed with a machined surface with one end thereof connected to said upper surface and the other end thereof connected to a corresponding one of said side surfaces, said machined surface being extending in a direction different from said upper surface and said side surfaces.

2. A semiconductor device as described in claim 1, wherein said tab suspension leads are each bent at an intermediate point thereof inward of said seal member by one step, and obverse and reverse surfaces of said tab are located in said seal member.

3. A semiconductor device as described in claim 1, wherein a plurality of grooves are formed in a reverse surface of said tab by stamping, and said insulative resin making up said seal member is filled in said grooves.

4. A semiconductor device as described in claim 1, wherein grooves are formed along each of sides of said tab in a square shape.

5. A semiconductor device as described in claim 1, wherein the surface reverse to the surface of said tab on which said semiconductor element is fixed is exposed from the mounting surface of said seal member.

6. A semiconductor device as described in claim 1, wherein said machined surfaces are flat.

7. A semiconductor device as described in claim 6, wherein the angle formed between said upper surface and each of said machined surfaces is larger than 90 degrees.

8. A semiconductor device as described in claim 6, wherein said machined surfaces are each bent in multiple steps.

9. A semiconductor device as described in claim 1, wherein each of said machined surfaces is arcuate.

10. A semiconductor device as described in claim 1, wherein the angle formed between said lower surface and each of said side surfaces is larger than the angle formed between said upper surface and each of said side surfaces.

11. A semiconductor device as described in claim 1, wherein in said inverted trapezoid-like section, the length (width) between the point where said machined surface on one side joins said side surface on one side and the point where said machined surface on the other side joins said side surface on the other side is longest, the width of said upper surface is next longest, and the width of said lower surface is shortest.

12. A semiconductor device as described in claim 1, wherein the lead portion is projected to side surfaces of said seal member and has the inverted trapezoid-like section having said machined surfaces, and the width of said upper surface of said inverted trapezoid-like section is equal or very approximate to the width of said lower surface of said inverted trapezoid-like section.

13. A semiconductor device as described in claim 12, wherein the surface of the lead portion is formed with a plating film.

14. A semiconductor device as described in claim 1, wherein each of said plurality of leads includes a plurality of lead portions having different inverted trapezoid-like sections having different widths of said upper surface along the direction in which said plurality of leads extend.

15. A semiconductor device as described in claim 14, wherein at least one of said inverted trapezoid-like sections include a different boundary height from the lower surface of said inverted trapezoid-like section to the point where one of said side surfaces joins the corresponding one of said machined surfaces.

16. A semiconductor device as described in claim 15, wherein said boundary height is changed stepwise.

17. A semiconductor device as described in claim 1, wherein said plurality of leads, said tab and said tab suspension leads are formed by stamping for punching through from said lower surface to said upper surface.

18. A semiconductor device as described in claim 17, wherein protrusion and rounding of a punched edge generated by said punching process are flattened by stamping.

19. A semiconductor device as described in claim 1, wherein said plurality of leads, said tab and said tab suspension leads are formed by stamping for punching through from said upper surface to said lower surface.

20. A semiconductor device as described in claim 19, wherein protrusion and rounding of a punched edge generated by said punching process are flattened by stamping.

21. A semiconductor device as described in claim 1, wherein at least a portion of each of said plurality of leads has a polygonal section.

22. A semiconductor device as described in claim 1, wherein the width of at least a part of the lead portion located in said seal member is larger than the width of a part of the lead portion projected from side surfaces of said seal member.

23. A semiconductor device as described in claim 1, wherein a surface of each of said plurality of leads is formed with a groove, and a corresponding one of said wires is connected to a part of the surface of each of said plurality of leads nearer to said semiconductor element than said groove.

24. A semiconductor device as described in claim 1, wherein a forward end surface of each of the plurality of leads projected from a side surface of said seal member is aligned with a forward end surface of resin filled between adjacent ones of the plurality of leads, and a forward end surface of each of the tab suspension leads projected from the side surface of said seal member is aligned with a forward end surface of resin filled between one of said tab suspension leads and an adjacent one of the plurality of leads.

25. A semiconductor device as described in claim 1, wherein a wire connection area of each of said plurality of leads is selectively formed with a plating film, and a corresponding one of said wires is connected on said plating film.

26. A semiconductor device as described in claim 1, wherein said tab, said tab suspension leads and said plurality of leads are each formed of a metal.

27. A semiconductor device as described in claim 1, wherein said tab, said tab suspension leads and said plurality of leads are formed of the same metal material.

28. A semiconductor device as described in claim 1, wherein said plurality of leads are arranged around said tab, and said insulative resin is filled between said plurality of leads and said tab.

29. A method of fabricating a semiconductor device, comprising:

(a) the step of fabricating a lead frame including a plurality of leads, a tab having a surface for fixing a semiconductor element, a plurality of tab suspension leads connected to said tab, and a frame portion for connecting said plurality of leads and said tab suspension leads;

(b) the step of mounting a semiconductor element on said semiconductor element fixing surfaces through an adhesive;

(c) the step of connecting electrodes of said semiconductor element electrically to said plurality of leads through wires;

(d) the step of forming a seal member of an insulative resin for sealing said semiconductor element, said wires, said plurality of leads and said tab suspension leads with said insulative resin in such a manner that reverse surfaces of said tab suspension leads and said plurality of leads are exposed from said insulative resin; and (e) the step of separating said plurality of leads and said tab suspension leads from said frame portion;

wherein said lead frame is fabricated in such a manner that a metal plate is punched a plurality of times repeatedly by punch stamping thereby to form patterns, after which a predetermined portion is pressed by stamping, said pressing process is performed in such a manner that at least a lead portion of the leads of said lead frame is formed by stamping with a lower die and an upper die into an inverted trapezoid-like section including an upper surface embedded in said seal member, a lower surface opposed to said upper surface and exposed from said seal member, and side surfaces are formed into machined surfaces, respectively, having an end thereof connected to said upper surface and the other end thereof connected to said side surfaces, said machined surfaces extending in a direction different from said upper surface and said side surface.

30. A method of fabricating a semiconductor device as described in claim 29, wherein said plurality of leads, said tab suspension leads, resin existing between said plurality of leads, and resin existing between each of said tab suspension leads and an adjacent lead are cut off from said frame portion at a position distant from and in proximity to said seal member along an outer periphery of said seal member.

31. A method of fabricating a semiconductor device as described in claim 29, comprising:
the step of forming said lead frame as a single flat metal plate; and
the step of forming the portion of each of said tab suspension leads connected to said tab by extrusion molding one step with stamping in such a manner that the surface of said tab for fixing said semiconductor element has a projected surface;
wherein said step of forming a seal member of said insulative resin includes the step of sealing the whole of said tab in said seal member.

32. A method of fabricating a semiconductor device as described in claim 31, wherein said step of extrusion molding said tab and the portion of said tab suspension lead connected to said tab by one step by stamping is the last step of stamping for forming said lead frame.

33. A method of fabricating a semiconductor device as described in claim 31, wherein a plurality of grooves are formed by stamping in a reverse surface of said tab.

34. A method of fabricating a semiconductor device as described in claim 33, wherein said tab is formed in square, and a groove is formed along each side of said tab in the reverse surface of said tab.

35. A method of fabricating a semiconductor device as described in claim 29, comprising the step of forming said frame portion of said lead frame, said plurality of leads, said tab and said tab suspension leads into a single flat metal plate;
wherein said step of forming a seal member of said insulative resin includes the step of sealing said resin in such a manner that a reverse surface of said tab is exposed to a mounting surface of said seal member.

36. A method of fabricating a semiconductor device as described in claim 29, wherein said machined surfaces are formed as flat surfaces.

37. A method of fabricating a semiconductor device as described in claim 29, wherein the angle formed between said upper surface and each of said machined surfaces is larger than 90 degrees.

38. A method of fabricating a semiconductor device as described in claim 29, wherein said machined surfaces are formed as arcuate surfaces.

39. A method of fabricating a semiconductor device as described in claim 29, wherein said inverted trapezoid-like section is formed in such a manner that the length (width) between each of said machined surfaces and the corresponding one of said side surfaces connected with said machined surface is longest, the width of said upper surface is next longest, and the width of said lower surface is shortest.

40. A method of fabricating a semiconductor device as described in claim 29, wherein the lead portion is projected to a side surface of said seal member and is formed into the inverted trapezoid-like section having said machined surfaces in such a manner that the width of the upper surface of said inverted trapezoid-like section is equal to or very approximate to the width of the lower surface of said inverted trapezoid-like section.

41. A method of fabricating a semiconductor device as described in claim 29, wherein a plurality of inverted trapezoid-like sections having different widths of the upper surface thereof are formed along the direction in which said plurality of leads extend.

42. A method of fabricating a semiconductor device as described in claim 41, wherein a plurality of inverted trapezoid-like sections having different widths of the upper surface thereof are formed along the direction in which said plurality of leads extend, in such a manner that at least a part of said inverted trapezoid-like sections are formed to have a different boundary height as measured from the lower surface to the point where each of the side surface joins the corresponding machined surface.

43. A method of fabricating a semiconductor device as described in claim 29, wherein a groove is formed by stamping transversely of a lead between a wire bonding area for said lead connected with a corresponding one of said wires and an outer end of said lead.

44. A method of fabricating a semiconductor device as described in claim 29, wherein protrusion and rounding of a punched edge generated by said punching process are flattened by stamping.

45. A method of fabricating a semiconductor device as described in claim 29, wherein said plurality of leads are flattened by stamping after performing the process for pressing said plurality of leads.

46. A method of fabricating a semiconductor device as described in claim 29, wherein said plurality of leads are flattened by stamping after forming a groove in a surface of each of said plurality of leads.

47. A method of fabricating a semiconductor device as described in claim 29, wherein said tab is formed by punch stamping after forming a plating film on the surface of a metal plate including said surface for fixing said semiconductor element.

48. A method of fabricating a semiconductor device as described in claim 29, wherein an inverted trapezoid-like section having said machined surfaces is formed by said lead pressing process, after which a groove is formed by stamping transversely of said lead between a wire bonding area of said lead connected with said wire and an outer end of said lead.

49. A method of fabricating a semiconductor device as described in claim 29, wherein said plurality of leads, said tab suspension leads, resin filled between said plurality of leads, and resin filled between each of said tab suspension leads and an adjacent lead are cut off at a position distant from and in proximity to said seal member along an outer periphery of said seal member so that a forward end surface of said plurality of leads and said tab suspension leads are aligned with a forward end surface of said resin on both sides of each of said plurality of leads and said tab suspension leads.

50. A method of fabricating an electronic apparatus, comprising:
(a) the step of fabricating a lead frame including a plurality of leads, a tab having a surface for fixing a semiconductor element, a plurality of tab suspension leads connected to said tab, and a frame portion for connecting said plurality of leads and said tab suspension leads;
(b) the step of mounting the semiconductor element on said semiconductor element fixing surface by means of an adhesive;
(c) the step of connecting electrodes of said semiconductor element electrically to said plurality of leads through wires;

(d) the step of forming a seal member of an insulative resin for sealing said semiconductor element, said wires, said plurality of leads and said tab suspension leads with said insulative resin in such a manner that reverse surfaces of said tab suspension leads and said plurality of leads are exposed from said insulative resin;

(e) the step of separating said plurality of leads and said tab suspension leads from said frame portion;

(f) the step of preparing a wiring board having electrodes at positions in opposed relation to the leads, respectively, exposed to a mounting surface of said seal member;

(g) the step of placing the electrodes on said wiring board and said plurality of leads in opposed relation to each other through solder paste; and (h) the step of fusing said solder paste by heat treatment and connecting said plurality of leads and said electrodes on said wiring board electrically to each other;

wherein said lead frame is fabricated in such a manner that a metal plate is punched a plurality of times repeatedly by the punch stamping process thereby to form patterns, after which a predetermined portion is pressed by the pressing process, said pressing process is performed in such a manner that at least a part of the lead of said lead frame is formed, by stamping using a lower die and an upper die, into an inverted trapezoid-like section including an upper surface embedded in said seal member, a lower surface opposed to said upper surface and exposed from said seal member, and two side surfaces connecting the two side edges of said upper surface and said lower surface to each other, said two side edges of said upper surface being formed into machined surfaces, respectively, with one end thereof connected to said upper surface and the other end thereof connected to the corresponding one of said side surfaces, said machined surfaces extending in a different direction with said upper surface and said side surfaces.

51. A method of fabricating an electronic apparatus as described in claim 50, wherein said plurality of leads, said tab suspension leads, resin existing between said plurality of leads, and resin existing between each of said tab suspension leads and an adjacent lead are cut off from said frame portion at a position distant from and in proximity to said seal member along an outer periphery of said seal member.

52. A method of fabricating an electronic apparatus as described in claim 50, comprising:

the step of forming said lead frame as a single flat metal plate; and the step of extrusion molding, by stamping one step higher, the portion of said tab suspension lead connected with said tab in such a manner that said semiconductor element fixing surface of said tab is projected;

wherein said step of forming said seal member of the insulative resin includes the step of sealing the whole of said tab in said seal member.

53. A method of fabricating an electronic apparatus as described in claim 52, wherein said step of extrusion molding by stamping said tab and the portion of said tab suspension lead connected with said tab is the last step of stamping for forming said lead frame.

54. A method of fabricating an electronic apparatus as described in claim 52, wherein at least a groove is formed in a reverse surface of said tab by stamping.

55. A method of fabricating an electronic apparatus as described in claim 54, wherein said tab is formed in square, and a groove is formed along each side of said tab in the reverse surface of said tab.

56. A method of fabricating an electronic apparatus as described in claim 50, comprising the step of forming said frame portion of said lead frame, a plurality of said lead portions, said tab and a plurality of said tab suspension leads into a single flat metal plate;

wherein said step of forming a seal member of said insulative resin includes the step of sealing said resin in such a manner that a reverse surface of said tab is exposed to the mounting surface of said seal member.

57. A method of fabricating an electronic apparatus as described in claim 50, wherein said machined surfaces are formed as flat surfaces.

58. A method of fabricating an electronic apparatus as described in claim 50, wherein the angle formed between said upper surface and each of said machined surfaces is larger than 90 degrees.

59. A method of fabricating an electronic apparatus as described in claim 50, wherein said machined surfaces are formed as arcuate surfaces.

60. A method of fabricating an electronic apparatus as described in claim 50, wherein said inverted trapezoid-like section is formed in such a manner that the length (width) between the point where said machined surface on one side joins said side surface on one side and the point where said machined surface on the other side joins said side surface on the other side is longest, the width of said upper surface is next longest, and the width of said lower surface is shortest.

61. A method of fabricating an electronic apparatus as described in claim 50, wherein each of the lead portions projected to a side surface of said seal member is formed to have an inverted trapezoid-like section having said machined surfaces in such a manner that the width of the upper surface of said inverted trapezoid-like section is equal to or very approximate to the width of the lower surface of said inverted trapezoid-like section.

62. A method of fabricating an electronic apparatus as described in claim 50, wherein a plurality of inverted trapezoid-like sections having different widths of the upper surface thereof are formed along the direction in which said plurality of leads extend.

63. A method of fabricating an electronic apparatus as described in claim 62, wherein a plurality of inverted trapezoid-like sections having different widths of the upper surface thereof are formed along the direction in which said plurality of leads extend, in such a manner that at least a part of said inverted trapezoid-like sections have different boundary heights from the lower surface to the point where each of the side surfaces joins the corresponding one of the machined surfaces.

64. A method of fabricating an electronic apparatus as described in claim 50, wherein a groove is formed by stamping transversely of each of said plurality of leads between a wire bonding area of said lead connected with a corresponding one of said wires and an outer end of said lead.

65. A method of fabricating an electronic apparatus as described in claim 50, wherein protrusion and rounding generated at a punched edge by the punch stamping of said plurality of leads, said tab and said tab suspension leads are flattened by stamping.

66. A method of fabricating an electronic apparatus as described in claim 50, wherein said plurality of leads are flattened by stamping after being pressed.

67. A method of fabricating an electronic apparatus as described in claim 50, wherein each of said plurality of leads is flattened by stamping after forming a groove in a surface of said lead.

68. A method of fabricating an electronic apparatus as described in claim 50, wherein said tab is formed by the punch stamping after forming a plating film on the metal plate surface including said surface for fixing said semiconductor element.

69. A method of fabricating an electronic apparatus as described in claim 50, wherein an inverted trapezoid-like section having said machined surfaces is formed by performing the pressing process on said plurality of leads, after which a groove is formed by stamping along the width of each of said plurality of leads between a wire bonding area of said lead connected with a corresponding one of said wires and an outer end of said lead.

70. A method of fabricating an electronic apparatus as described in claim 50, wherein said plurality of leads, said tab suspension leads, resin filled between said plurality of leads, and resin filled between each of said tab suspension leads and an adjacent lead are cut off at a nearby position distant from and in proximity to said seal member along an outer periphery of said seal member, and a forward end surfaces of said plurality of leads and said tab suspension leads are aligned with a forward end surface of said resin on the two sides of the forward end surface of each of said plurality of leads and each of said tab suspension leads.

71. A method of fabricating an electronic apparatus as described in claim 50, wherein:
said step (d) includes the step of forming a seal member of said insulative resin in such a manner that reverse surfaces of said tab, said tab suspension leads and said plurality of leads are exposed from said insulative resin;
said step (f) includes the step of preparing a wiring board having corresponding electrodes on said tab;
said step (g) includes the step of arranging the electrodes on said wiring board in opposed relation to said plurality of leads and said tab through solder paste; and
said step (h) includes the step of fusing said solder paste by heat treatment and connecting said plurality of leads and said tab electrically to said electrodes, respectively, on said wiring board.

72. A semiconductor device comprising a seal member having a mounting surface, a plurality of leads partly sealed by said seal member and exposed to the mounting surface of said seal member, a semiconductor chip sealed by said seal member, and a plurality of wires sealed by said seal member for connecting said semiconductor chip and a plurality of said leads electrically to each other;
wherein each of a plurality of said leads includes a first portion and a second portion arranged nearer to said semiconductor chip than said first portion and having a larger width than said first portion,
said first portion and said second portion each have a set of side surfaces inclined in taper in opposed relation to each other and a bottom portion located on both sets of the side surfaces and exposed to the mounting surface of said seal member, and
the height of said set of said side surfaces of said first portion is lower than the height of said set of said side surfaces of said second portion.

73. A semiconductor device as described in claim 72, wherein each of a plurality of said wires is connected to the second portion of a plurality of said leads, respectively.

74. A semiconductor device as described in claim 72, wherein the taper angle of said set of the side surfaces of said first portion is the same as the angle taper of said set of the side surfaces of said second portion.

75. A semiconductor device as described in claim 72, wherein the width of said bottom portion of said first portion is equal to the width of said bottom portion of said second portion.

76. A method of fabricating a semiconductor device comprising a seal member having a mounting surface, a plurality of leads partly sealed by said seal member and exposed to the mounting surface of said seal member, a semiconductor chip sealed by said seal member, and a plurality of wires sealed by said seal member for connecting said semiconductor chip and a plurality of said leads electrically to each other, said method comprising:
(a) the step of preparing a lead frame including a frame portion and lead portions connected to said frame portion, and each of said lead portions having a first portion and a second portion wider than said first portion;
(b) the step of forming a set of tapered side surfaces in opposed relation to each other by plastically deforming each of said first portion and said second portion of said lead portion in a groove having tapered side surfaces;
(c) the step of connecting said lead portions and a semiconductor chip electrically to each other through wires;
(d) the step of sealing said semiconductor chip and a plurality of said wires by forming a seal member and sealing a part of said lead portions in such a manner as to expose a bottom surface of said lead portions located between said set of said side surfaces of each of said lead portions; and
(e) the step of separating said lead portions and said frame portion from each other after forming said seal member.

77. A method of fabricating a semiconductor device as described in claim 76, wherein said step (b) is such that the taper angle of said groove formed in a set of the side surfaces of said first portion is equal to the taper angle of said groove formed in a set of the side surfaces of said second portion.

78. A method of fabricating a semiconductor device, comprising:
(a) the step of fabricating a lead frame including a plurality of leads, a tab having a surface for fixing a semiconductor element, a plurality of tab suspension leads connected to said tab, and a frame portion for connecting said plurality of leads and said tab suspension leads to each other;
(b) the step of mounting the semiconductor element on said semiconductor element fixing surface by means of an adhesive;
(c) the step of connecting electrodes of said semiconductor element electrically to said plurality of leads through wires;
(d) the step of forming a seal member of an insulative resin for sealing said semiconductor element, said wires, said plurality of leads and said tab suspension leads with said insulative resin in such a manner that reverse surfaces of said tab suspension leads and said plurality of leads are exposed from said insulative resin; and
(e) the step of separating said plurality of leads and said tab suspension leads from said frame portion;
wherein said lead frame is fabricated in such a manner that a metal plate is punched a plurality of times repeatedly by the punch stamping process thereby to form patterns, after which a predetermined portion is pressed by the pressing process, said pressing process is performed in such a manner that at least a part of the leads of said lead frame is formed, by stamping using a lower die and an upper die, into an inverted trapezoid-like section including an upper surface embedded in said seal member, a lower surface opposed to said upper surface and exposed from said seal member, and side surfaces connecting two side edges of said upper surface and said lower surface, respectively, said two side edges being formed in machined surfaces, respectively, each having one end thereof connected to said upper surface and the other end thereof connected to the corresponding one of said side surfaces, said machined surfaces extending in a different direction with said upper surface and said side surfaces, and said tab suspension leads are such that a groove is formed transversely of each tab suspension lead in the reverse surface thereof, after which said tab suspension lead is bent at said groove portion so that said tab supported on said tab suspension leads is embedded in said seal member.

79. A method of fabricating a semiconductor device as described in claim 78, wherein said groove is a V-shaped groove formed of a fixed surface perpendicular to the reverse surface of said tab suspension lead and a movable surface formed nearer to said tab and inclined at a predetermined angle to the reverse surface of said tab suspension lead.

80. A method of fabricating a semiconductor device as described in claim 79, wherein said V-shaped groove is expanded at an angle of 60 degrees.

81. A method of fabricating a semiconductor device as described in claim 78, wherein said groove is formed in said tab suspension lead, after which the area portion including at least a portion exposed from said seal member on both sides of said groove is flattened by flat beating obverse and reverse surfaces of said tab suspension lead.

82. A method of fabricating a semiconductor device as described in claim 78, wherein said plurality of leads, said tab suspension leads, resin existing between said plurality of leads, and resin existing between said each of said tab suspension leads and an adjacent lead are cut off from said frame portion at a position distant from and in proximity to said seal member along an outer periphery of said seal member.

83. A method of fabricating a semiconductor device as described in claim 78, comprising:

the step of forming said lead frame as a single flat metal plate;

the step of forming said groove in a reverse surface of each of said tab suspension leads; and the step of extrusion molding the portion of each of said tab suspension leads connected with said tab by one step higher by stamping in such a manner that said semiconductor element fixing surface of said tab has a projected surface;

wherein said step of forming a seal member of said insulative resin includes the step of sealing said resin in such a manner as to cover the whole of said tab in said seal member.

84. A method of fabricating a semiconductor device as described in claim 78, wherein the angle formed between said upper surface and each of said machined surfaces is larger than 90 degrees.

85. A method of fabricating a semiconductor device as described in claim 78, wherein said machined surfaces are each formed as an arcuate surface.

86. A method of fabricating a semiconductor device as described in claim 78, wherein said inverted trapezoid-like section is formed in such a manner that the length (width) between the portions where said machined surfaces are connected with said side surfaces is longest, the width of said upper surface is next longest, and the width of said lower surface is shortest.

87. A method of fabricating a semiconductor device as described in claim 78, wherein a plurality of inverted trapezoid-like sections having different widths of the upper surface are formed along the direction in which said plurality of leads extend.

* * * * *